US010483956B2

(12) United States Patent
Tsuji

(10) Patent No.: US 10,483,956 B2
(45) Date of Patent: Nov. 19, 2019

(54) PHASE INTERPOLATOR, TIMING GENERATOR, AND SEMICONDUCTOR INTEGRATED CIRCUIT

(71) Applicant: ROHM CO., LTD., Kyoto-shi, Kyoto (JP)

(72) Inventor: Masanobu Tsuji, Kyoto (JP)

(73) Assignee: ROHM CO., LTD., Ukyo-Ku, Tokyo (JP)

( * ) Notice: Subject to any disclaimer, the term of this patent is extended or adjusted under 35 U.S.C. 154(b) by 0 days.

(21) Appl. No.: 16/039,921

(22) Filed: Jul. 19, 2018

(65) Prior Publication Data
US 2019/0028093 A1    Jan. 24, 2019

(30) Foreign Application Priority Data

Jul. 20, 2017 (JP) ................................ 2017-140754
Jul. 20, 2017 (JP) ................................ 2017-140755

(51) Int. Cl.
G06F 1/04 (2006.01)
H03H 11/26 (2006.01)
(Continued)

(52) U.S. Cl.
CPC ............. H03K 5/156 (2013.01); H03L 7/07 (2013.01); H03L 7/0814 (2013.01); H03K 2005/00052 (2013.01)

(58) Field of Classification Search
CPC  H03K 5/156; H03K 2005/00052; H03L 7/07; H03L 7/0814
See application file for complete search history.

(56) References Cited

U.S. PATENT DOCUMENTS 5,969,556 A * 10/1999 Hayakawa ............. H03K 3/289
327/202
6,052,016 A * 4/2000 Sugiura ................. H02J 7/0031
327/393
(Continued)

FOREIGN PATENT DOCUMENTS

JP    2001273048 A    10/2001
JP    2001339280 A    12/2001
(Continued)

OTHER PUBLICATIONS

Aravind Tharayil Narayanan et al., "A Fractional-N Sub-Sampling PLL using a Piplined Phase-Interpolar With an FoM of-250 dB," IEEE Journal of Solid-State Circuits, vol. 51, No. 7, Jul. 2016, pp. 1630-1640.

Primary Examiner — Kenneth B Wells
(74) Attorney, Agent, or Firm — Cantor Colburn LLP

(57) ABSTRACT

During a period in which a first signal $S_1$ and second signal $S_2$ are both set to a first level, an initializing circuit initializes a capacitor voltage. Multiple circuit units are coupled in parallel between an intermediate line and a second line. An output circuit generates an output signal $S_{OUT}$ that changes level when the capacitor voltage crosses a predetermined threshold value $V_{TH}$. Each circuit unit includes a resistor $R_g$ and first path arranged in series between the intermediate and second lines and a second path parallel to the first path. The first path is configured to turn on when the first signal $S_1$ is the second level and the corresponding bit of an input code is a first value. The second path is configured to turn on when the second signal $S_2$ is the second level and the corresponding bit of the input code is a second value.

11 Claims, 33 Drawing Sheets

(51) Int. Cl.
   *G06M 1/10* (2006.01)
   *H03K 5/156* (2006.01)
   *H03L 7/07* (2006.01)
   *H03L 7/081* (2006.01)
   *H03K 5/00* (2006.01)

(56) References Cited

U.S. PATENT DOCUMENTS

| | | | | |
|---|---|---|---|---|
| 6,583,655 | B2* | 6/2003 | Takahashi | H03L 7/0814 |
| | | | | 327/151 |
| 6,621,317 | B2* | 9/2003 | Saeki | H03K 5/133 |
| | | | | 327/156 |
| 6,643,787 | B1* | 11/2003 | Zerbe | G06F 1/10 |
| | | | | 713/400 |
| 7,009,434 | B2* | 3/2006 | Lee | G11C 7/22 |
| | | | | 327/158 |
| 7,129,761 | B2* | 10/2006 | Lee | H03L 7/0814 |
| | | | | 327/158 |
| 7,274,236 | B2* | 9/2007 | Lee | H03H 11/265 |
| | | | | 327/158 |
| 7,697,592 | B2* | 4/2010 | Ogasawara | H03K 5/133 |
| | | | | 375/130 |
| 9,991,848 | B1* | 6/2018 | Francese | H03D 7/166 |
| 2016/0277015 | A1* | 9/2016 | Ma | H03K 5/1565 |
| 2017/0092343 | A1* | 3/2017 | Palmer | G06F 13/1689 |

FOREIGN PATENT DOCUMENTS

| | | |
|---|---|---|
| JP | 2002190724 A | 7/2002 |
| JP | 2003087113 A | 3/2003 |
| JP | 2006319966 A | 11/2006 |
| JP | 2011259286 A | 12/2011 |
| JP | 2012231394 A | 11/2012 |
| JP | 2013046271 A | 3/2013 |
| WO | 2012167239 A2 | 12/2012 |

* cited by examiner

PHASE INTERPOLATOR, TIMING GENERATOR, AND SEMICONDUCTOR INTEGRATED CIRCUIT

CROSS-REFERENCE TO RELATED APPLICATIONS

The present application claims priority under 35 U.S.C. § 119 to Japanese patent application No. 2017-140755 filed on Jul. 20, 2017 and the Japanese patent application No. 2017-140754 filed on Jul. 20, 2017, the content of which is incorporated herein by reference.

BACKGROUND OF THE INVENTION

1. Field of the Invention

The present invention relates to a phase interpolator.

2. Description of the Related Art

A phase interpolator circuit is employed in a semiconductor integrated circuit (which will be referred to as the "IC" hereafter) in order to generate an intermediate phase obtained by internal division of two signal phases. The phase of a given signal is associated with the edges of the signal.

SUMMARY OF THE INVENTION

The present invention has been made in view of such a situation. Accordingly, it is an exemplary purpose of an embodiment of the present invention to provide a novel phase interpolator that differs from those according to conventional techniques.

An embodiment of the present invention relates to a phase interpolator. The phase interpolator comprises: a first input node coupled to receive a first signal that transits from a first level to a second level; a second input node coupled to receive a second signal that transits from the first level to the second level with a delay with respect to the first signal; a first line coupled to receive a first voltage; a second line coupled to receive a second voltage; an intermediate line; a capacitor having one end coupled to the intermediate line; an initializing circuit structured to initialize a voltage across the capacitor during a period in which the first signal and the second signal are both set to the first level; multiple circuit units that correspond to multiple bits of an input code, and coupled in parallel between the intermediate line and the second line; and an output circuit structured to generate an output signal having a level that changes when the voltage across the capacitor crosses a predetermined threshold value. Each circuit unit comprises: a resistor and a first path arranged in series between the intermediate line and the second line; and a second path arranged in parallel with the first path. The first path is structured such that, when the first signal is set to the second level and the corresponding bit of the input code is set to a first value, the first path is turned on. The second path is structured such that, when the second signal is set to the second level and the corresponding bit of the input code is set to a second value, the second path is turned on.

With this embodiment, with the delay time of the second signal with respect to the first signal as $T_P$, and the number of the circuit units as N, this arrangement is capable of controlling the phase of the output signal with $T_P/N$ as a unit of delay width.

This arrangement requires no current source that determines the charging current or discharging current (which will collectively be referred to as the "charging/discharging current") to be used for charging or discharging the capacitor. Accordingly, with an embodiment, this arrangement allows an operation with low voltage.

In a case of employing a current source, such an arrangement requires a bias circuit to bias the current source. This has the potential to cause a problem of a delay that occurs when the operation is started. In contrast, this embodiment requires no bias circuit. Accordingly, such an embodiment is capable of starting the phase interpolation operation without involving the startup operation of the bias circuit when the operation is started.

In a case in which the capacitor is discharged (or otherwise charged) by means of only a MOS (Metal Oxide Semiconductor) transistor without employing such a resistor and a current source, there is a need to design the charging/discharging current based on the gate length L of the MOS transistor. In this case, as the gate length L is increased in order to reduce the current, the gate capacitance becomes larger, leading to increased power consumption. Alternatively, it is possible to adjust the charging/discharging current based on the channel width W of the MOS transistor. However, in a case in which the channel width W is reduced in order to reduce the current, this leads to increased variation, resulting in degraded performance. In addition, the minimum value of the channel width W has a limitation in the manufacturing process. Accordingly, in a case of employing a method for designing the charging/discharging current based on only the parameters W and L of the MOSFET, it is difficult to support both low power consumption and high performance. In contrast, with this embodiment, the charging/discharging current can be designed by means of a resistor. Accordingly, with an embodiment, this arrangement allows the gate capacitance of the first switch to be reduced, thereby allowing power consumption to be reduced.

Furthermore, this arrangement enables circuit design using both the capacitance of the capacitor and the resistance value of the resistor as parameters. Accordingly, this arrangement enables design giving consideration to a balance between the precision, the circuit area, and the power consumption.

Also, the first path and the second path may each comprise a first switch and a second switch. Also, the first signal may be input to the first switch of the first path. Also, the second signal may be input to the first switch of the second path. Also, the corresponding bit of the input code may be input to the second switch of the first path. Also, a complementary signal of the corresponding bit of the input code may be input to the second switch of the second path.

Also, the second switch may be arranged between the first switch and the resistor. This arrangement provides improved DNL (Differential Non-Linearity) and improved INL (Integral Non-Linearity) as compared with an arrangement in which the second switch is not provided between the first switch and the resistor.

Also, each of the first path and the second path may further comprise a third switch arranged on a side opposite to the second switch with the first switch interposed between them. Also, the corresponding bit of the input code may be input to the third switch of the first path. Also, a complementary signal of the corresponding bit of the input code may be input to the third switch of the second path.

This arrangement is capable of further suppressing the effects of clock feedthrough and charge injection on the resistor side circuit and the intermediate line side. Accordingly, this allows the DNL (Differential Non-Linearity) and the INL (Integral Non-Linearity) to be further improved.

Also, one end of the resistor may be coupled to the second line. Also, the first path may be arranged between the other end of the resistor and the intermediate line.

Also, one end of the resistor may be coupled to the intermediate line. Also, the first path may be arranged between the other end of the resistor and the second line.

Also, the initializing circuit may comprise: an initializing transistor arranged between the first line and the intermediate line; and a logic gate structured to turn on the initializing transistor during a period in which the first signal and the second signal are both set to the first level.

Also, the capacitor may be configured as a variable capacitor. Also, the other end of the capacitor may be grounded.

Another embodiment of the present invention relates to a timing generator. The timing generator is configured as a combination of the multiple phase interpolators described above. The timing generator comprises N (N≥2) stages. The i-th (1≤i≤N−1) stage comprises a first phase interpolator and a second phase interpolator. An output node of the first phase interpolator in the i-th (1≤i≤N−1) stage is coupled to a first input node of each of the first phase interpolator and the second interpolator in the (i+1)-th stage. An output node of the second phase interpolator in the i-th stage is coupled to a second input node of each of the first phase interpolator and the second interpolator in the (i+1)-th stage. The first phase interpolator and the second phase interpolator are each arranged such that a first signal is received via the first input node and such that a second signal is received via the second input node, and structured to generate an output signal having an edge at a timing that corresponds to control data.

With this embodiment, the resolution K of each stage may be employed as a design parameter. Specifically, the resolution of the overall operation of the timing generator can be designed based on the resolutions K and the number of stages N. Theoretically, this arrangement is capable of limitless improvement of the time resolution regardless of the frequency of the reference signal. Furthermore, the signal having timing information in the form of edges does not pass through a multiplexer (analog switch). Accordingly, this arrangement allows a high-precision timing control operation. Furthermore, the number of stages N can be designed to be small by adjusting the resolution K of each stage. This allows variation involved due to an increased number of stages to be suppressed.

In the N-th stage, either the first phase interpolator or the second phase interpolator may be omitted. This allows the circuit area to be reduced.

Also, in the i-th (1≤i≤N−1) stage, there may be a time difference between edges of output signals of the first phase interpolator and the second phase interpolator that corresponds to a time resolution provided by the stage. For example, there may be a difference of 1 between the code values to be supplied to the first phase interpolator and the second phase interpolator.

In the first stage, a common first reference signal may be input to each of the first input nodes of the first phase interpolator and the second phase interpolator. Also, a common second reference signal may be input to each of the second input nodes of the first phase interpolator and the second phase interpolator.

In the first stage, a first reference signal may be input to the first input node of the first phase interpolator. Also, a common second reference signal may be input to the second input node of the first phase interpolator and the first input node of the second phase interpolator. Also, a third reference signal may be input to the second input node of the second phase interpolator.

Also, the phase interpolator may comprise: a capacitor; a charging/discharging circuit structured (i) to charge or otherwise discharge the capacitor with an amount of current that corresponds to the control data according to the first signal after the first timing, and (ii) to charge or otherwise discharge the capacitor with a constant amount of current according to the second signal after the second timing; and an output circuit structured to generate the output signal having a level that changes when a voltage across the capacitor reaches a threshold value.

With an embodiment, a phase interpolator comprises: a first input node structured to receive a first signal that transits from a first level to a second level; a second input node structured to receive a second signal that transits from the first level to the second level with a delay with respect to the first signal; a first line via which a first voltage is to be supplied; a second line via which a second voltage is to be supplied; an intermediate line; a capacitor arranged such that one end thereof is coupled to the intermediate line; an initializing circuit structured to initialize a voltage across the capacitor during a period in which the first signal and the second signal are both set to the first level; multiple circuit units that correspond to multiple bits of an input code, and coupled in parallel between the intermediate line and the second line; and an output circuit structured to generate an output signal having a level that changes when the voltage across the capacitor crosses a predetermined threshold value. Each circuit unit comprises: a resistor and a first path arranged in series between the intermediate line and the second line; and a second path arranged in parallel with the first path. The first path is structured such that, when the first signal is set to the second level and the corresponding bit of the input code is set to a first value, the first path is turned on. The second path is structured such that, when the second signal is set to the second level and the corresponding bit of the input code is set to a second value, the second path is turned on.

With this embodiment, with the delay time of the second signal with respect to the first signal as $T_P$, and with the number of the circuit units as N, the phase of the output signal can be controlled with $T_P/N$ as a unit of delay width.

This arrangement requires no current source for determining the charging current or the discharging current (which will collectively be referred to as the "charging/discharging current") to be used for charging or discharging the capacitor. Accordingly, with an embodiment, this arrangement is capable of operating with low voltage.

In a case of employing such a current source, this arrangement requires a bias circuit for biasing the current source. In some cases, this leads to a problem of a delay when the operation is started. In contrast, this embodiment requires no bias circuit. Accordingly, with such an embodiment, this arrangement allows a phase interpolation operation without requiring the startup operation of the bias circuit when the operation is started.

In a case in which the capacitor is discharged (or otherwise charged) by means of only a MOS (Metal Oxide Semiconductor) transistor without employing such a resistor and a current source, there is a need to design the charging/discharging current based on the gate length L of the MOS transistor. In this case, as the gate length L is increased in order to reduce the current, the gate capacitance becomes larger, leading to increased power consumption. Alternatively, it is possible to adjust the charging/discharging current based on the channel width W of the MOS transistor. However, in a case in which the channel width W is reduced in order to reduce the current, this leads to increased variation, resulting in degraded performance. In addition, the minimum value of the channel width W has a limitation in the manufacturing process. Accordingly, in a case of employing a method for designing the charging/discharging current based on only the parameters W and L of the MOSFET, it is difficult to support both low power consumption and high performance. In contrast, with this embodiment, the charging/discharging current can be designed by means of a resistor. Accordingly, with an embodiment, this arrangement allows the gate capacitance of the first switch to be reduced, thereby allowing power consumption to be reduced.

Furthermore, this arrangement enables circuit design using both the capacitance of the capacitor and the resistance value of the resistor as parameters. Accordingly, this arrangement enables design giving consideration to a balance between the precision, the circuit area, and the power consumption.

Also, the first path and the second path may each comprise a first switch and a second switch. Also, the first signal may be input to the first switch of the first path. Also, the second signal may be input to the first switch of the second path. Also, the corresponding bit of the input code may be input to the second switch of the first path. Also, a complementary signal of the corresponding bit of the input code may be input to the second switch of the second path.

Also, the second switch may be arranged between the first switch and the resistor. This arrangement provides improved DNL (Differential Non-Linearity) and improved INL (Integral Non-Linearity) as compared with an arrangement in which the second switch is not provided between the first switch and the resistor.

Also, each of the first path and the second path may further comprise a third switch arranged on a side opposite to the second switch with the first switch interposed between them. Also, the corresponding bit of the input code may be input to the third switch of the first path. Also, a complementary signal of the corresponding bit of the input code may be input to the third switch of the second path.

This arrangement is capable of suppressing the effects of clock feedthrough and charge injection on the resistor side circuit and the intermediate line side. Accordingly, this allows the DNL (Differential Non-Linearity) and the INL (Integral Non-Linearity) to be further improved.

Also, one end of the resistor may be coupled to the second line. Also, the first path may be arranged between the other end of the resistor and the intermediate line.

Also, one end of the resistor may be coupled to the intermediate line. Also, the first path may be arranged between the other end of the resistor and the second line.

Also, the initializing circuit may comprise: an initializing transistor arranged between the first line and the intermediate line; and a logic gate structured to turn on the initializing transistor during a period in which the first signal and the second signal are both set to the first level.

Also, the capacitor may be configured as a variable capacitor. Also, the other end of the capacitor may be grounded.

Yet another embodiment of the present invention relates to a semiconductor integrated circuit. The semiconductor integrated circuit comprises a delay pulse generator. The delay pulse generator may comprise: a set signal generator structured to generate a set signal; and a reset signal generator structured to generate a reset signal. Also, at least one from among the set signal generator and the reset signal generator may comprises any one of the timing generators described above. The delay pulse generator may output a pulse signal that transits to a first level according to an output signal of the set signal generator, and that transits to a second level according to an output signal of the reset signal generator.

The pulse signal may be configured as a pulse width modulation signal. In a case in which the edges on both sides are to be modulated, both the set signal generator and the reset signal generator may each be configured as the timing generator described above. In a case in which only either one of the edges on both sides is to be modulated, only either the set signal generator or the reset signal generator may be configured as the timing generator described above. The other signal generator may be configured as a fixed delay circuit.

Also, the semiconductor integrated circuit may be configured as a controller for a class D amplifier, a controller for a DC/DC converter, a controller for an LED driver, or a controller for a motor.

Yet another embodiment of the present invention relates to a timing generator. The timing generator comprises N (N≥2) stages. The i-th (1≤i≤N−1) stage comprises a first phase interpolator and a second phase interpolator. An output node of the first phase interpolator in the i-th (1≤i≤N−1) stage is coupled to a first input node of each of the first phase interpolator and the second interpolator in the (i+1)-th stage. An output node of the second phase interpolator in the i-th stage is coupled to a second input node of each of the first phase interpolator and the second interpolator in the (i+1)-th stage. The first phase interpolator and the second phase interpolator are each arranged such that a first signal is received via the first input node and such that a second signal is received via the second input node, and structured to generate an output signal having an edge at a timing that corresponds to control data.

With this embodiment, the resolution K of each stage may be employed as a design parameter. Specifically, the resolution of the overall operation of the timing generator can be designed based on the resolutions K and the number of stages N. Theoretically, this arrangement is capable of limitless improvement of the time resolution regardless of the frequency of the reference signal. Furthermore, the signal having timing information in the form of edges does not pass through a multiplexer (analog switch). Accordingly, this arrangement allows a high-precision timing control operation. Furthermore, the number of stages N can be designed to be small by adjusting the resolution K of each stage. This allows variation involved due to an increased number of stages to be suppressed.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

Furthermore, the description of such items (methods for solving the problem) does not necessarily describe all necessary features of the present invention. That is to say, a sub-combination of such features described above is encompassed within the technical scope of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection between them, or that does not damage the functions of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions of the connection between them, in addition to a state in which they are directly coupled.

First Embodiment

Figure 1:
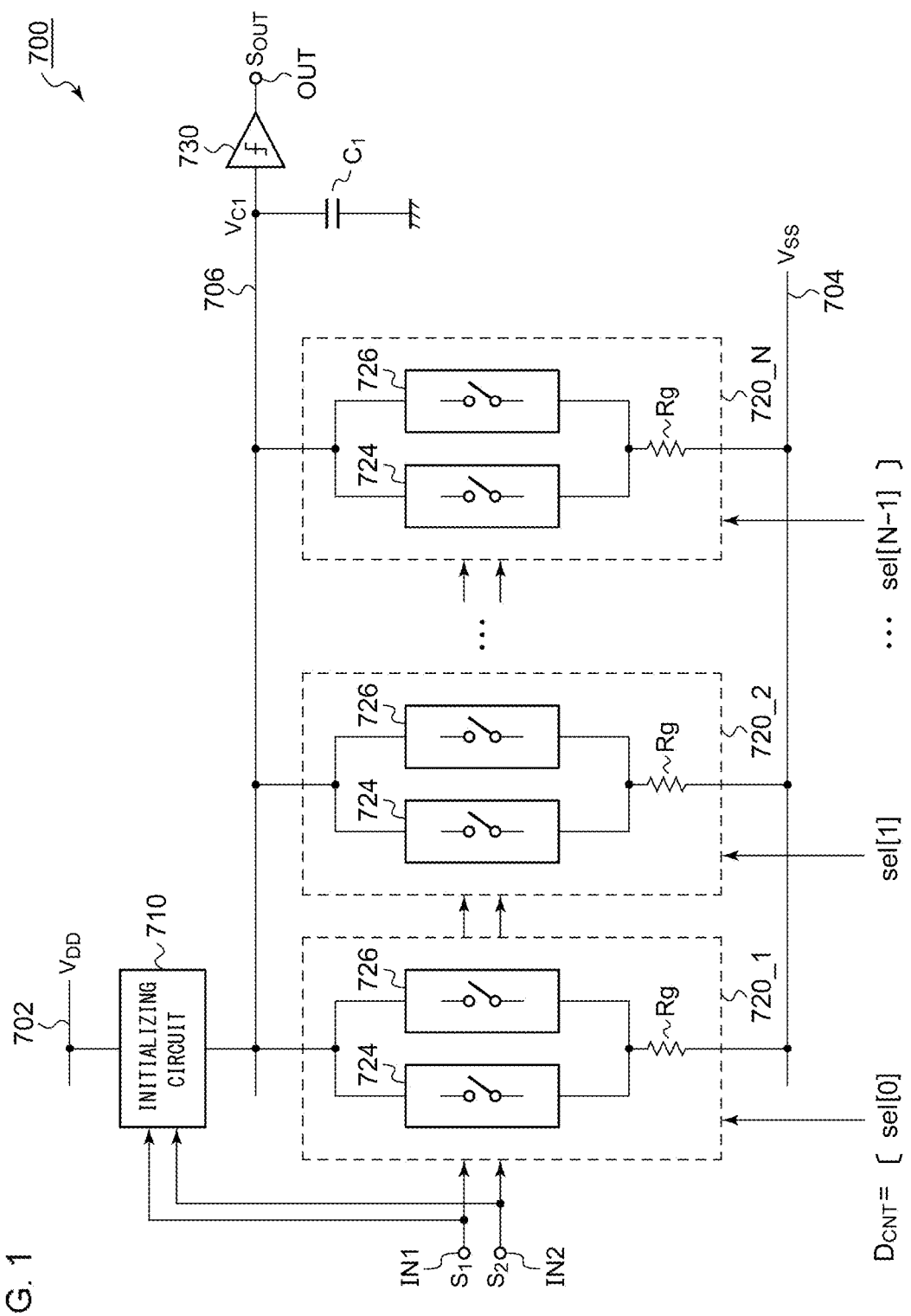
FIG. 1 is a circuit diagram showing a phase interpolator according to a first embodiment.

FIG. 1 is a circuit diagram showing a phase interpolator 700 according to a first embodiment. The phase interpolator 700 includes a first input node IN1, a second input node IN2, and an output node OUT. The two input nodes IN1 and IN2 receive, as input signals, a first signal $S_1$ having an edge at a first timing $\phi_A$ and a second signal $S_2$ having an edge at a second timing $\phi_B$, respectively. The phase interpolator 700 generates an output signal $S_{OUT}$ having an edge at a timing $\phi_{OUT}$ that corresponds to an input code $D_{CNT}$, and outputs the output signal $S_{OUT}$ via an output node OUT. For ease of understanding, description will be made assuming that the first timing $\phi_A$ precedes the second timing $\phi_B$, and with the time difference between them as $T_P$. The time difference will also be referred to as the "reference time $T_P$". Description will be made in this embodiment assuming that the timing (phase) is defined by a positive edge (rising edge or leading edge).

The phase interpolator 700 includes a first line 702, a second line 704, an intermediate line 706, a capacitor $C_1$, an initializing circuit 710, multiple circuit units 720_1 through 720_N, an output circuit 730, and an input buffer 740. The number N of the circuit units 720 corresponds to the number of signal levels (time resolution) of the phase interpolator 700, i.e., the number of signal levels of the input code $D_{CNT}$. That is to say, the number N of the circuit units 720 is equal to the number of bits of the input code $D_{CNT}$ in a case in which the input code $D_{CNT}$ is represented by a thermometer code.

The first voltage is supplied to the first line 702, and the second voltage is supplied to the second line 704. Description will be made in the present embodiment regarding an arrangement in which the power supply voltage $V_{DD}$ is employed as the first voltage and the ground voltage $V_{SS}$ ($V_{GND}$) is employed as the second voltage. Accordingly, the first line 702 corresponds to the power supply line, and the second line 704 corresponds to the ground line.

One end of the capacitor $C_1$ is coupled to the intermediate line 706. The other end of the capacitor $C_1$ is grounded, and accordingly, the electric potential at this end is fixed The initializing circuit 710 is arranged between the first line 702 and the intermediate line 706. During a period in which the first signal $S_1$ and the second signal $S_2$ are both set to the first level (low level), the initializing circuit 710 initializes the voltage (which will be referred to as the "capacitor voltage $V_{C1}$") across the capacitor $C_1$. With this arrangement, the power supply voltage $V_{DD}$ of the first line 702 is employed as the initializing voltage.

The multiple circuit units 720_1 through 720_N are coupled in parallel between the intermediate line 706 and the second line 704. The multiple circuit units 720_1 through 720_N each have a function of discharging the charge stored in the capacitor $C_1$.

The output circuit 730 generates an output signal $S_{OUT}$ having a level that changes when the capacitor voltage $V_{C1}$ crosses a predetermined threshold voltage $V_{TH}$. The timing at which the capacitor voltage $V_{C1}$ crosses the predetermined threshold value $V_{TH}$ will be referred to as the "output timing $\phi_{OUT}$". The output signal $S_{OUT}$ has an edge at the output timing $\phi_{OUT}$. For example, the output circuit 730 can be configured as a CMOS inverter, a buffer, or a voltage comparison mechanism such as a voltage comparator, a dynamic latch circuit, a level shift circuit, or the like, for binarizing a voltage signal. However, the configuration of the output circuit 730 is not restricted to such an arrangement.

The multiple circuit units 720_1 through 720_N each have the same configuration. Each circuit unit 720 includes a resistor $R_g$, a first path 724, and a second path 726.

One end of the resistor $R_g$ is coupled to the second line 704. The first path 724 is arranged between the other end of the resistor $R_g$ and the intermediate line 706. When the first signal $S_1$ is set to the second level (high level) and the corresponding bit sel of the input code $D_{CNT}$ is set to a first value (which is "1" in this example), the first path 724 is turned on.

Furthermore, the second path 726 is arranged in parallel with the first path 724 between the other end of the resistor $R_g$ and the intermediate line 706. When the second signal $S_2$ is set to the second level (high level) and the corresponding bit sel of the input code $D_{CNT}$ is set to a second value (which is "0" in this example), the second path 726 is turned on.

The above is the basic configuration of the phase interpolator 700.

The phase interpolator 700 has a simple circuit configuration including no current source, thereby allowing the phase interpolator 700 to operate with a low voltage. Furthermore, as described later in detail, the phase interpolator 700 is resistant to the effects of process variation, power supply voltage variation, and temperature variation. In addition, the phase interpolator 700 can be started up at high speed.

Furthermore, the effect of the variation in the resistor $R_g$ appears as a small deviation of the relative time difference between the edge timing $\phi_A$ of the first signal $S_1$ and the edge timing $\phi_B$ of the second signal $S_2$. Accordingly, such an effect can substantially be ignored. This arrangement does not require additional processing such as high-precision trimming of the resistor $R_g$.

The present invention encompasses various kinds of apparatuses and circuits that can be regarded as a block configuration or a circuit configuration shown in FIG. 1, or otherwise that can be derived from the aforementioned description. That is to say, the present invention is not restricted to a specific configuration. Description will be made below regarding more specific example configurations and modifications for clarification and ease of understanding of the essence of the present invention and the circuit operation. That is to say, the following description will by no means be intended to restrict the technical scope of the present invention.

First Example

Figure 2:
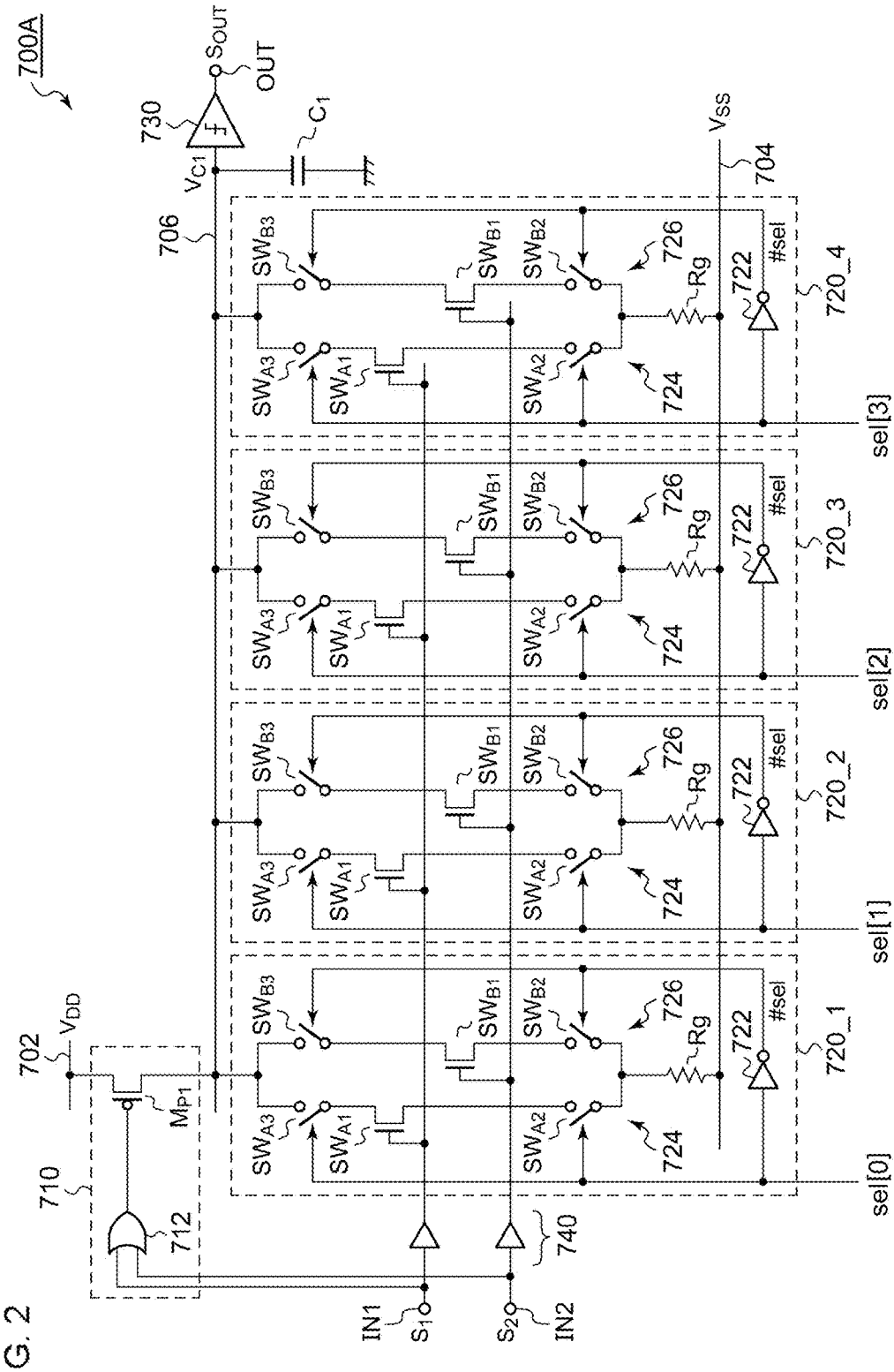
FIG. 2 is a circuit diagram showing a phase interpolator according to a first example.

FIG. 2 is a circuit diagram showing a phase interpolator 700A according to a first example. The initializing circuit 710 includes an initializing transistor $M_{P1}$ configured as a PMOS transistor and a logic gate 712. The logic gate 712 outputs a signal that corresponds to the logical OR of the first signal $S_1$ and the second signal $S_2$ to the gate of the initializing transistor $M_{P1}$. In this example, the logic gate 712 is configured as an OR gate. During a period in which both the first signal $S_1$ and the second signal $S_2$ are set to the low level, the initializing transistor $M_{p1}$ is turned on, thereby initializing the capacitor voltage $V_{C1}$ to $V_{DD}$.

The first path 724 includes a first switch $SW_{A1}$ through a third switch $SW_{A3}$ coupled in series. Similarly, the second path 726 includes a first switch $SW_{B1}$ through a third switch $SW_{B3}$ coupled in series.

The first switches $SW_{A1}$ and $SW_{B1}$ are each configured as an NMOS transistor. The first signals $S_1$ and $S_2$ are input to the gates of the first switch $SW_{A1}$ and $SW_{B1}$, respectively. During a period in which the first signal $S_1$ is set to the second level (high level), the first switch $SW_{A1}$ of the first path 724 is turned on. During a period in which the second signal $S_2$ is set to the second level (high level), the first switch $SW_{B1}$ of the second path 726 is turned on. The input buffer 740 drives the multiple first switches $SW_{A1}$ and $SW_{B1}$ included in the multiple circuit units 720 according to the first signal $S_1$ and the second signal $S_2$. It should be noted that, in a case in which the circuit that generates the first signal $S_1$ and the second signal $S_2$ has a sufficiently low impedance (i.e., has a high driving capacity), the input buffer 740 can be omitted.

A pair of the second switch $SW_{A2}$ and the third switch $SW_{A3}$ of the first path 724 are turned on (off) in a complementary manner with respect to the second switch $SW_{B2}$ and the third switch $SW_{B3}$ of the second path 726. The second switches $SW_{A2}$ and $SW_{B2}$ and the third switches $SW_{A3}$ and $SW_{B3}$ may each be configured as the same type of transistor (i.e., an NMOS transistor) as the first switch $SW_{A1}$ and $SW_{B1}$.

The input code $D_{CNT}$ to be input to the interpolator 700 may be configured as an N-bit thermometer code. That is to say, the thermometer code includes N bits sel[0] through sel[N−1]. Each bit sel is supplied to the corresponding one of the multiple circuit units 720. In each circuit unit 720_i (1≤i≤N), a pair of the second switch $SW_{A2}$ and the third switch $SW_{A3}$ of the first path 724 is controlled according to the corresponding bit sel[i−1]. On the other hand, a pair of the second switch $SW_{B2}$ and the third switch $SW_{B3}$ of the second path 726 is controlled according to the inverted signal #sel[i−1] of the corresponding bit sel[i−1]. The inverted signal #sel may be generated by an inverter 722.

The multiple circuit units 720_1 through 720_N are each designed such that, when the first paths 724 (the second paths 726) are each in a conduction state, the first paths 724 (the second paths 726) each exhibit a uniform impedance which will be represented by R. The impedance R of the first path 724 is the sum total of the resistance value of the resistor $R_g$ and the on resistance values of the multiple switches $SW_{A1}$ through $SW_{A3}$. On the other hand, the impedance R of the second path 726 is the sum total of the resistance value of the resistor $R_g$ and the on resistance values of the multiple switches $SW_{B1}$ through $SW_{B3}$.

Figure 3A:
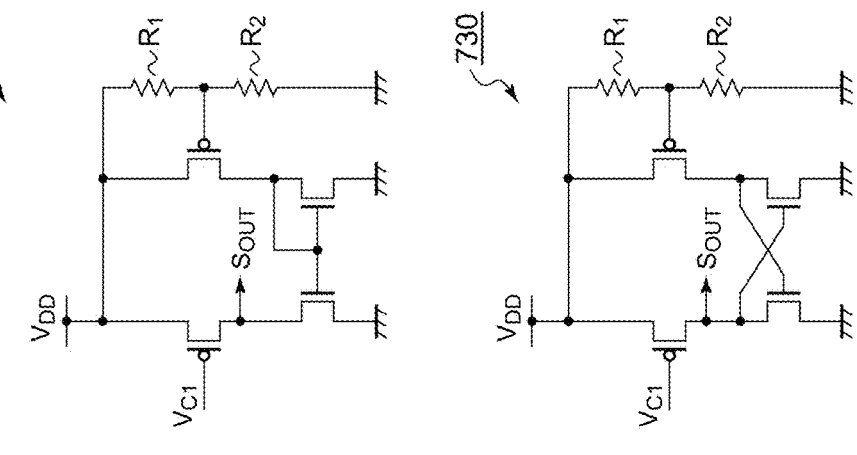
FIG. 3A through FIG. 3C are circuit diagrams each showing an example configuration of an output circuit.
Figure 3B:
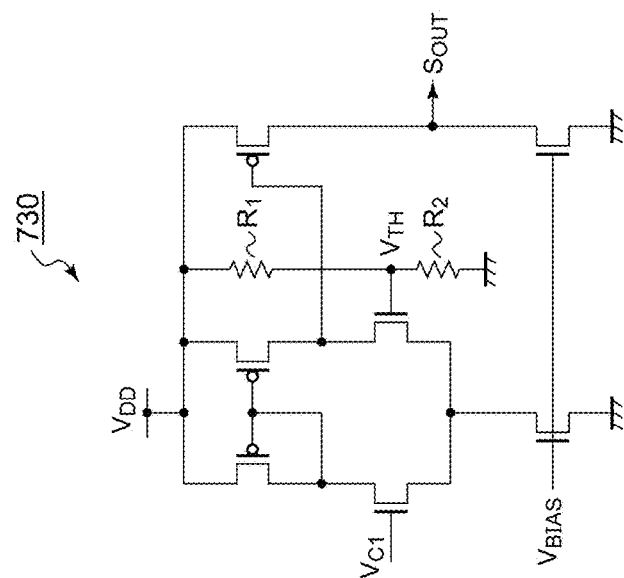
Figure 3C:
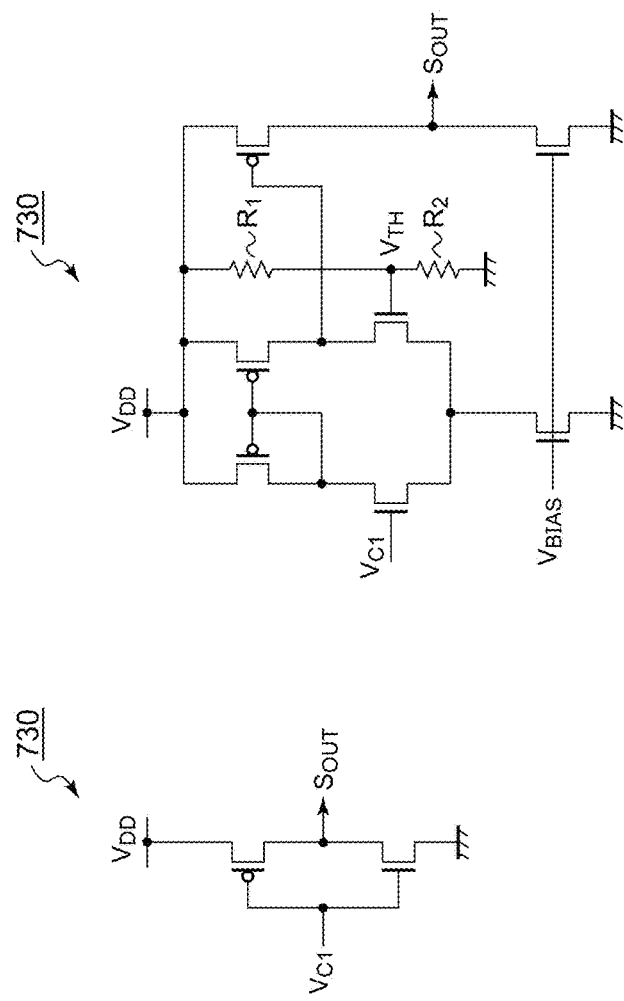
Figure 4:
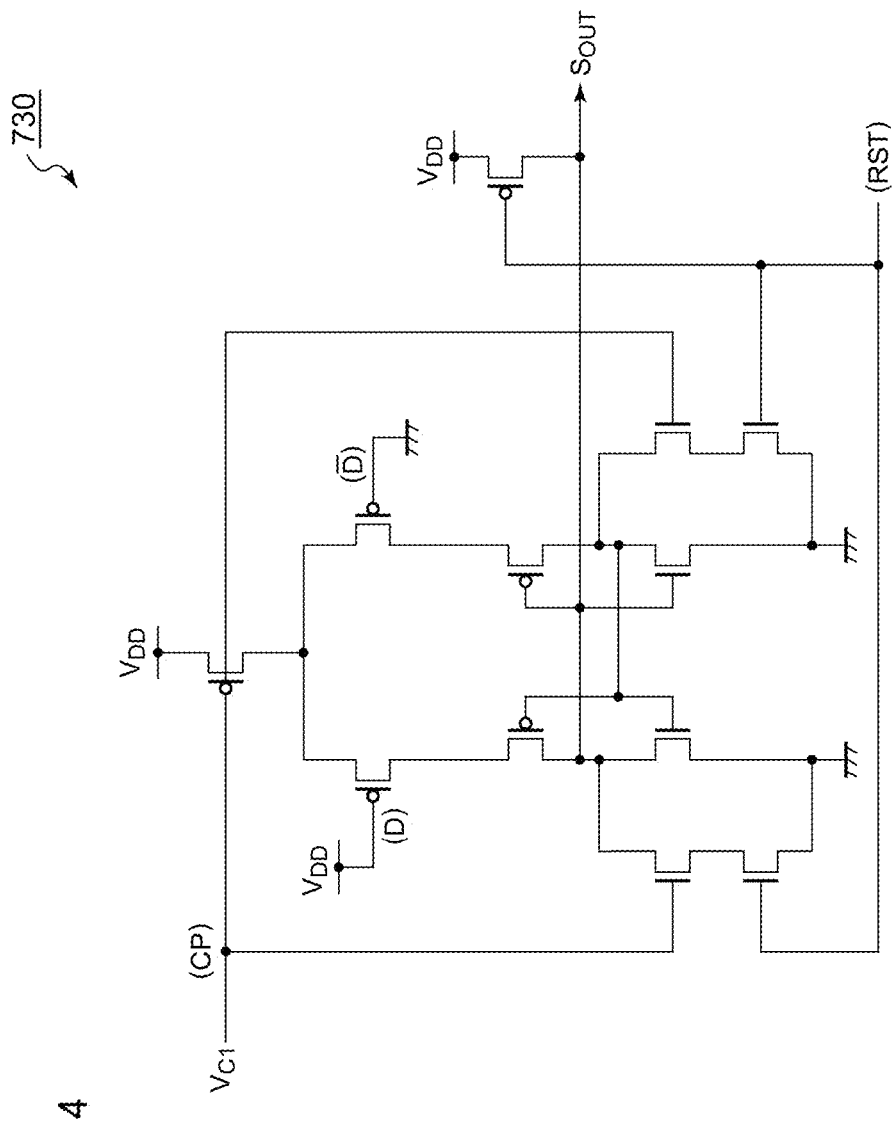
FIG. 4 is a circuit diagram showing another example configuration of the output circuit.

FIG. 3A through FIG. 3C are circuit diagrams each showing an example configuration of the output circuit 730. The output circuit 730 shown in FIG. 3A is configured as a CMOS inverter. The output circuit 730 shown in FIG. 3B is configured as a voltage comparator employing a differential amplifier. The output circuit 730 shown in FIG. 3C is configured employing a level shift circuit FIG. 4 is a circuit diagram showing an example configuration of the output circuit 730. The output circuit 730 shown in FIG. 4 is configured employing a dynamic latch circuit. The capacitor voltage $V_{C1}$ is input to an enable terminal (latch terminal, clock input) of the dynamic latch circuit. Furthermore, a reset signal RST (logical inversion) is input to the output circuit 730, which is configured to allow the output circuit 730 to be initialized before the voltage comparison operation. In an initialized state, the output $S_{OUT}$ is set to the high level. When the capacitor voltage $V_{C1}$ crosses a threshold value $V_{TH}$, the dynamic latch circuit is activated. In this state, the voltage $V_{DD}$ is compared with $V_{GND}$, and the output $S_{OUT}$ transits to the low level.

Figure 5:
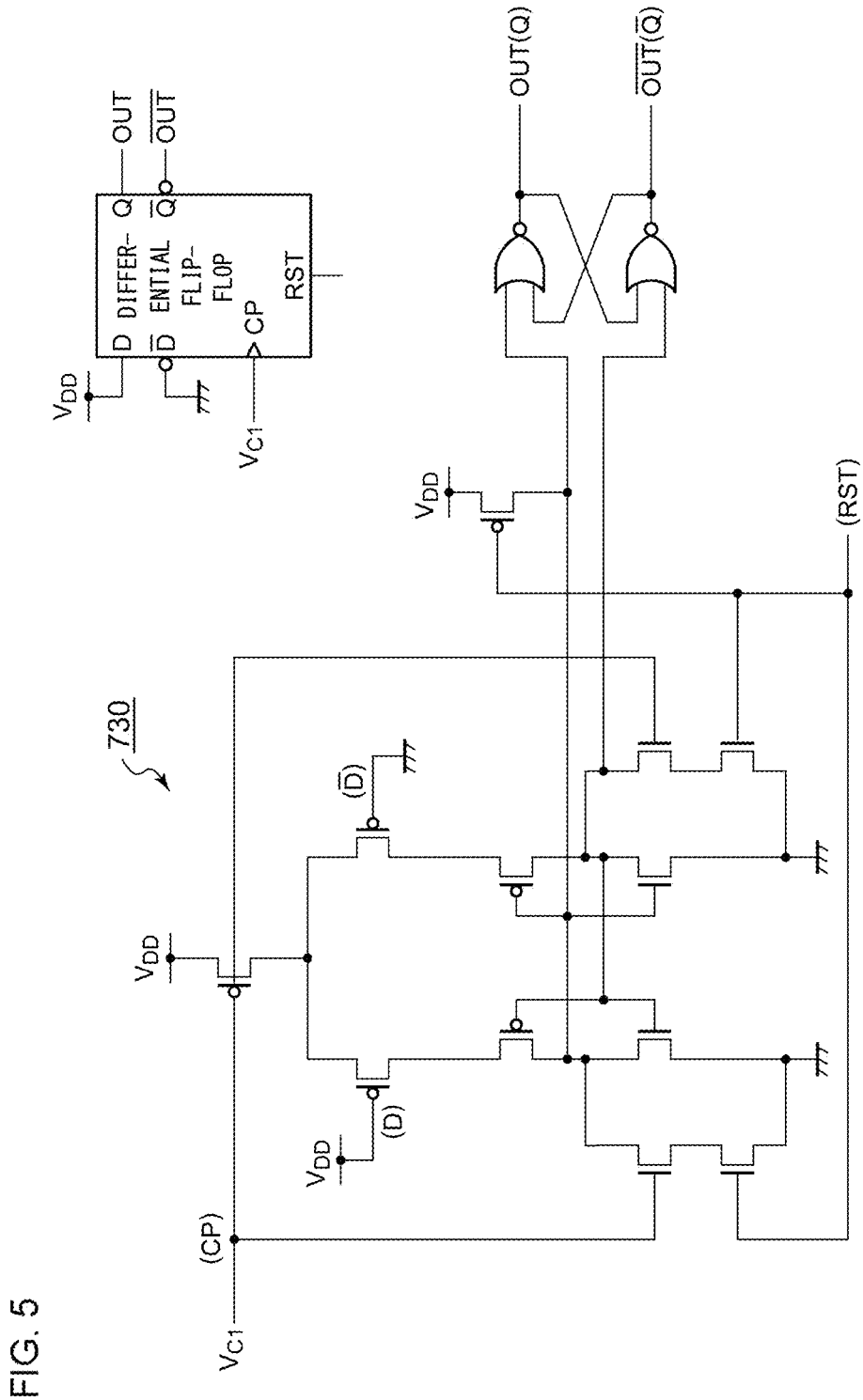
FIG. 5 is a circuit diagram showing yet another example configuration of the output circuit.

The output circuit 730 may be monolithically integrated with a downstream-stage circuit of the phase interpolator 700. For example, in a case in which a differential flip-flop is arranged as a downstream stage of the phase interpolator 700, the output circuit 730 may be built into the differential flip-flop. FIG. 5 is a circuit diagram showing a differential flip-flop including the output circuit 730 as a built-in component. The output circuit 730 shown in FIG. 5 has the same configuration as that of the dynamic latch circuit shown in FIG. 4.

Figure 6:
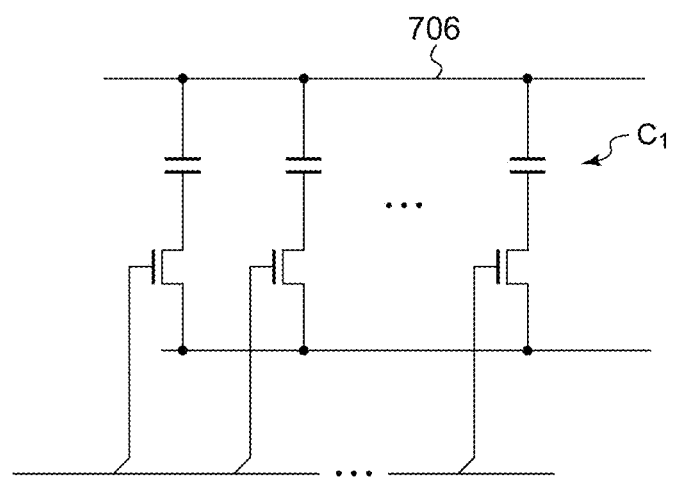
FIG. 6 is a circuit diagram showing an example configuration of a capacitor.

FIG. 6 is a circuit diagram showing an example configuration of the capacitor $C_1$. The capacitor $C_1$ may be configured as a variable capacitor. The configuration of the variable capacitor is not restricted in particular. The variable capacitor may be configured using known techniques. Also, the resistor $R_g$ may be configured as a variable resistor in addition to or instead of the capacitor $C_1$ configured as a variable capacitor.

The above is the configuration of the phase interpolator 700A. Next, description will be made regarding the operation of the phase interpolator 700A.

Figure 7:
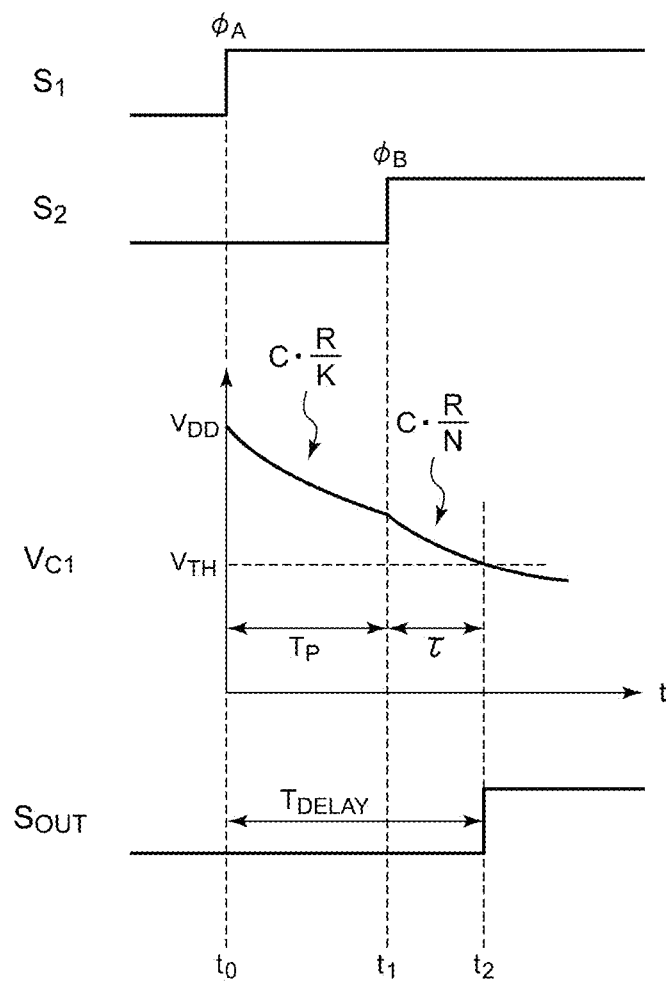
FIG. 7 is an operation waveform diagram showing the operation of the phase interpolator.

FIG. 7 is an operation waveform diagram showing the operation of the phase interpolator 700A. Description will be made regarding an example in which N=4. Before the time point $t_0$, the first signal $S_1$ and the second signal $S_2$ are both set to the low level. Accordingly, the capacitor voltage $V_{C1}$ is initialized to the power supply voltage $V_{DD}$ employed as the initial value. In this stage, the first signal $S_1$ and the second signal $S_2$ are both set to the low level. Accordingly, the first switches $SW_{A1}$ and $SW_{B1}$ are both turned off. In this state, the first path 724 and the second path 726 are in a disconnection state, and accordingly, the charge is held in the capacitor $C_1$.

Figure 8A:
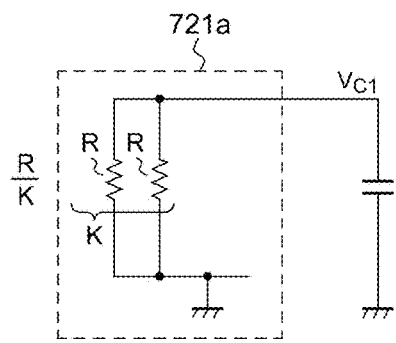
FIG. 8A and FIG. 8B are equivalent circuit diagrams for explaining the operation of the phase interpolator.
Figure 8B:
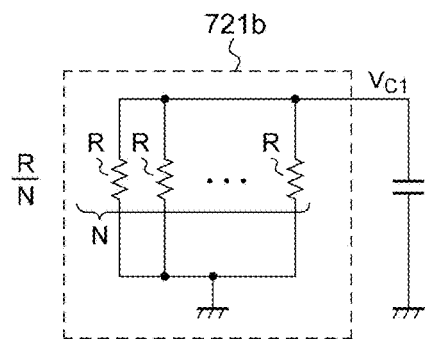

FIG. 8A and FIG. 8B are equivalent circuit diagrams each showing the operation of the phase interpolator 700. FIG. 8A shows a state in which the first signal $S_1$ is set to the high level and the second signal $S_2$ is set to the low level, i.e., a state from the time point $t_0$ to $t_1$ shown in FIG. 7. FIG. 8B shows a state in which the first signal $S_1$ and the second signal $S_2$ are both set to the high level, i.e., a state after the time point $t_1$ shown in FIG. 7. When the capacitor voltage $V_{C1}$ crosses the threshold voltage $V_{TH}$, the output signal $S_{OUT}$ switches its state.

Description will be made with the number of bits from among the thermometer code sel[N−, 0] input to the phase interpolator 700 having a value of 1 as K. Here, 0≤K≤N holds true.

In the state shown in FIG. 8A, the capacitor $C_1$ is discharged by a parallel connection circuit 721a comprising K resistors R. The resistance of the parallel connection circuit 721a is represented by R/K. The time constant thereof is represented by C·R/K. Accordingly, the capacitor voltage $V_{C1}(t_1)$ at the time point $t_1$ shown in FIG. 7 is represented by the following Expression (1).

$$V_{C1}(t_1) = V_{DD} \cdot \exp(-T_P/(C \cdot R/K)) \quad (1)$$

In the state shown in FIG. 8B, the capacitor $C_1$ is discharged via the parallel connection circuit 721b in which all the N resistors R are coupled in parallel without dependence on the value of the control code $D_{CNT}$ (i.e., K). The resistance of the parallel connection circuit 721b is represented by R/N. The time constant is represented by C·R/N.

With the voltage $V_{C1}(t)$ in Expression (1) as the initial value, the time $\tau$ required for the voltage $V_{C1}$ to fall to the threshold voltage $V_{TH}$ is represented by Expression (2).

$$\tau = C \cdot R/N \cdot \ln(V_{C1}(t_1)/V_{TH}) \quad (2)$$

By substituting Expression (1) into Expression (2), the following Expression (3) is derived.

$$\begin{aligned}\tau &= C \cdot R/N \cdot \ln(V_{DD} \cdot \exp(-T_P/(C \cdot R/K))/V_{TH}) \\ &= C \cdot R/N \cdot \{\ln(V_{DD}/V_{TH}) - T_P/(C \cdot R/K)\} \\ &= C \cdot R/N \cdot \ln(V_{DD}/V_{TH}) - T_P \cdot K/N\end{aligned} \quad (3)$$

Accordingly, the delay time $T_{DELAY}$ from the time point $t_0$ up to the time point $t_2$ is represented by Expression (4).

$$\begin{aligned}T_{DELAY} &= T_P + \tau \\ &= C \cdot R/N \cdot \ln(V_{DD}/V_{TH}) + T_P \cdot (N-K)/N\end{aligned} \quad (4)$$

The first term on the right side in Expression (4) is a constant (offset delay) independent of the control code. Accordingly, with the phase interpolator 700 according to the embodiment, the phase $\phi_{OUT}$ of the output signal $S_{OUT}$ can be controlled with the reference time $T_P/N$ as a time resolution (unit of delay width).

In a case in which a given capacitor is charged (or otherwise discharged) by means of a constant current source, the capacitor voltage changes in a linear manner. In contrast, in a case in which a given capacitor is discharged (or otherwise charged) by means of a resistor, the capacitor voltage changes in a nonlinear manner according to an exponential function determined by the CR time constant. Accordingly, intuitively, it would seem that, in a case of employing such resistors, this arrangement would involve poor precision as compared with a case in which such constant current sources are employed. However, Expression (4) mathematically demonstrates that the delay time can be controlled with high precision in a stepwise manner in increments of a unit of delay width $T_P/N$. That is to say, there is no disadvantage in employing such resistors. In contrast, the advantages in employing such resistors will be described later.

In order to generate a high-precision phase delay by means of the phase interpolator 700, the delay time $T_{DELAY}$ to be generated when (N−K)=1 is required to be larger than the reference time $T_P$. Accordingly, the reference time $T_P$ can be used in the following range.

$$T_P < C \cdot R \cdot \ln(V_{DD}/V_{TH})/(N-1)$$

It should be noted that the impedance R and the capacitor C may be determined such that the capacitor voltage $V_{C1}$ crosses the threshold voltage $V_{TH}$ after the reference time $T_P$ elapses from the start of discharging when the capacitor $C_1$ thus initialized is discharged by means of all the N circuit units 720. In other words, R and C may be determined such that the following relation expression holds true.

$$T_P = C \cdot R/N \cdot \ln(V_{DD}/V_{TH}) \quad (5)$$

By substituting Expression (5) into Expression (4), the following Expression (6) is derived.

$$T_{DELAY} = T_P + T_P/N \times (N-K) \quad (6)$$

That is to say, when K=N, the phase of the output signal $S_{OUT}$ matches that of the second signal $S_2$.

Figure 9:
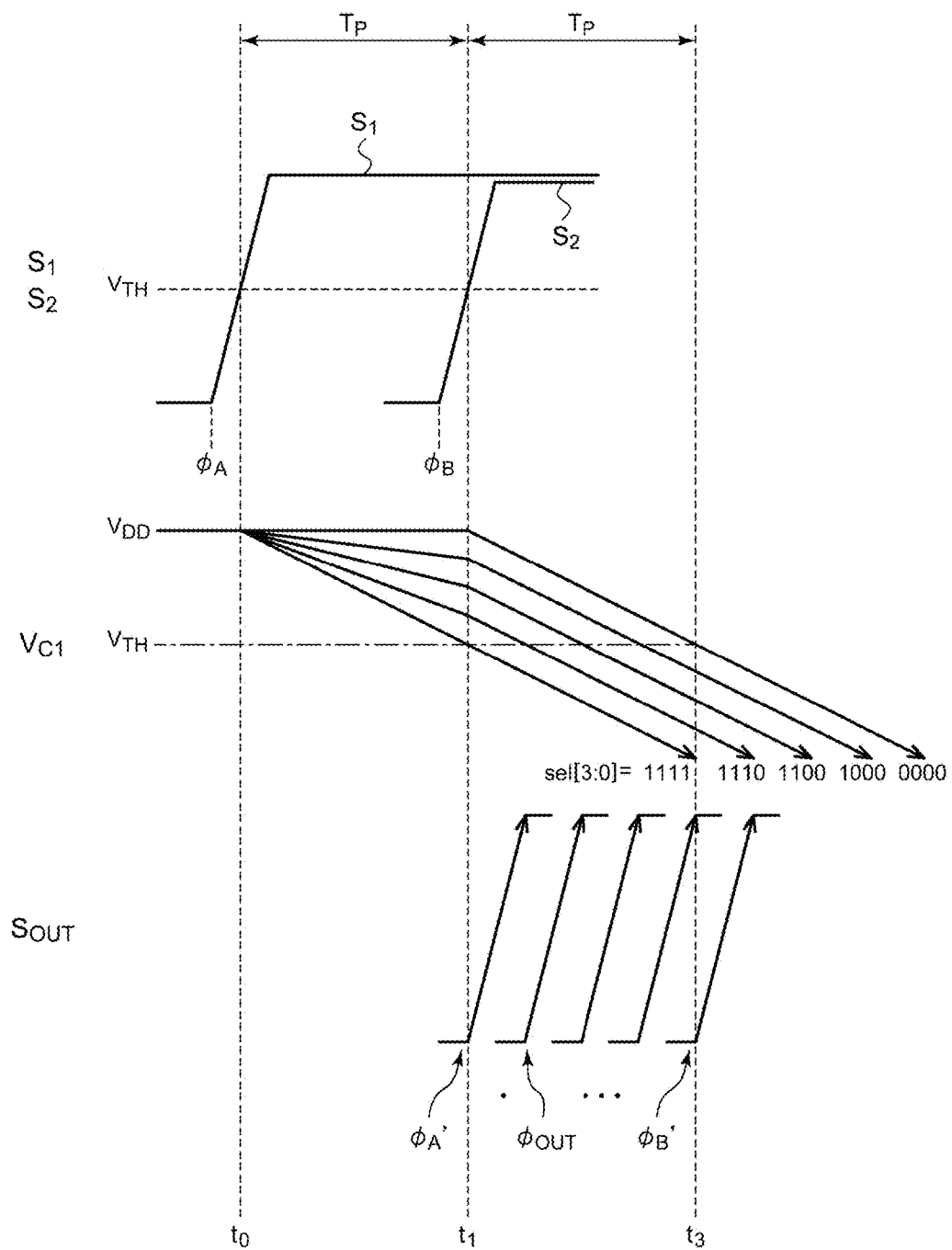
FIG. 9 is a diagram for explaining a dependence of the operation of the phase interpolator on a control code.

FIG. 9 is a diagram for explaining the operation of the phase interpolator 700 that is dependent on the control code. Here, for ease of understanding, the change in the capacitor voltage $V_{C1}$ is represented by a straight line. Description will be made assuming that the circuit is designed such that Expression (5) is satisfied. FIG. 9 shows the respective waveforms generated according to the control codes sel[3:0]=[1111] through [0000]. It should be noted that the control code is configured as a thermometer code, and therefore only the quantity of the numbers 1 has significance. That is to say, the order of bits has no significance. As can be clearly understood from FIG. 9, the phase $\phi_{OUT}$ of the output signal $S_{OUT}$ can be controlled according to the control code sel[3:0].

The above is the operation of the phase interpolator 700A. Next, description will be made regarding the advantages of the phase interpolator 700A. The advantages of the phase interpolator 700 can be clearly understood by making a comparison with several comparison techniques.

First Comparison Technique

Figure 10:
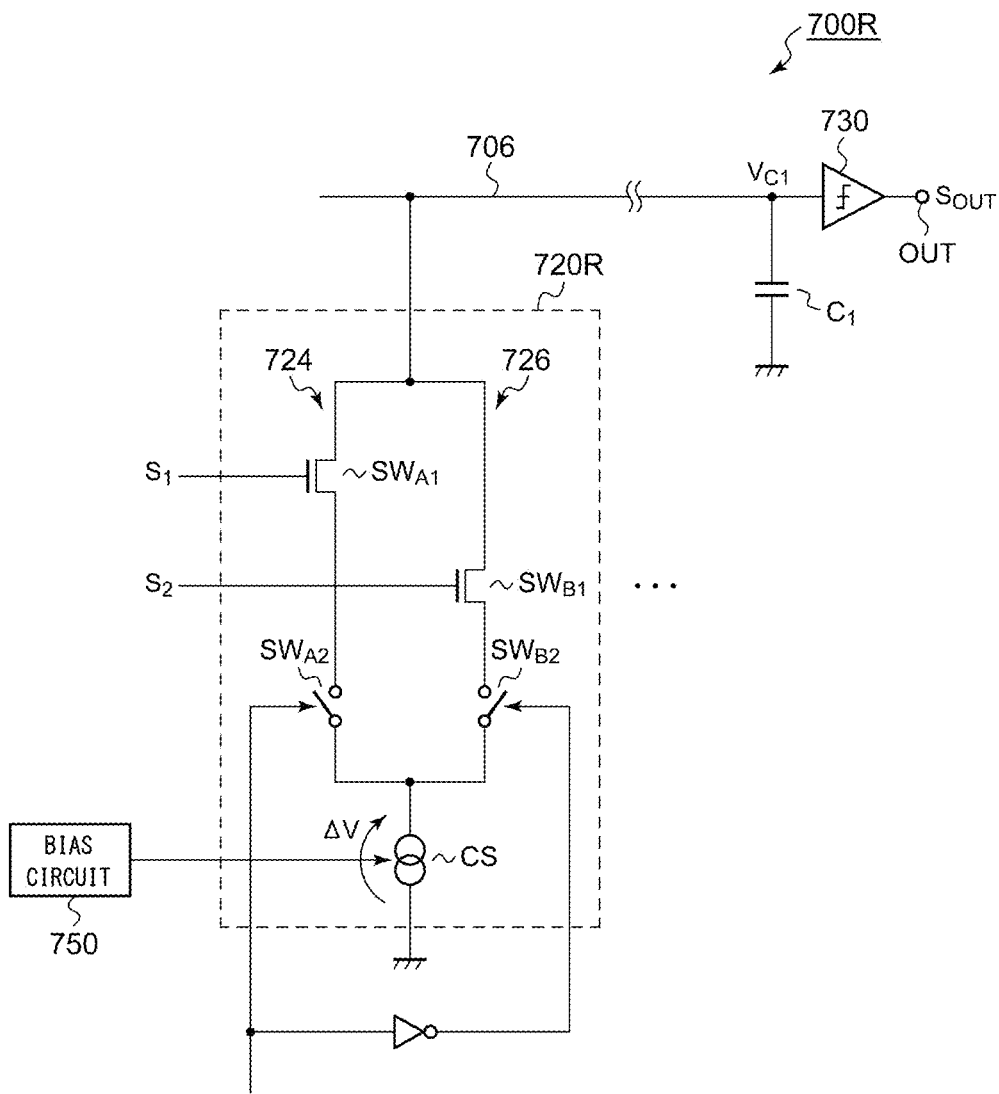
FIG. 10 is a simplified circuit diagram showing a phase interpolator according to a first comparison technique.

FIG. 10 is a simplified circuit diagram showing a phase interpolator 700R according to a first comparison technique. It should be noted that the comparison technique is by no means recognized as a known technique. Each circuit unit 720R of the phase interpolator 700R is provided with a current source CS instead of the resistor $R_g$ of the circuit unit 720. The phase interpolator 700R is required to maintain the voltage ΔV across both ends of the current source CS at a level that is higher than the saturation voltage $V_{SAT}$. Accordingly, this leads to a problem in that the power supply voltage $V_{DD}$ cannot be reduced. Also, this leads to large power consumption.

In contrast, the phase interpolator 700 according to the embodiment includes no current source CS. This allows the power supply voltage $V_{DD}$ to be reduced, thereby allowing the power consumption to be reduced. For example, in the 0.18 µm to 28 nm process generation, the MOS transistor is designed to have a threshold voltage Vth=0.25 through 0.7 V and an overdrive voltage Vod on the order of 0.15 to 0.2 V. Accordingly, the phase interpolator 700 according to the embodiment is capable of operating with $V_{DD}$ of 1 V or less. It has been confirmed that a phase interpolator 700 manufactured as a sample operates normally with $V_{DD}$ of 0.6 V or less.

Furthermore, in a case in which the current source CS are employed as with the comparison techniques, such an arrangement requires a bias circuit 750 in order to bias the current sources $C_S$. Accordingly, the phase interpolator 700 according to the embodiment is advantageous from the viewpoint of circuit area. Moreover, the phase interpolator 700 according to the embodiment can be designed without giving consideration to the effects of noise in the bias voltage, thereby allowing the circuit to be easily laid out.

Furthermore, with the comparison technique, the phase interpolator 700R is able to operate after the bias circuit 750 is started up after the IC power supply is turned on.

In contrast, with the embodiment, the phase interpolator 700 is able to operate immediately after the IC power supply is turned on.

Second Comparison Technique

Figure 11:
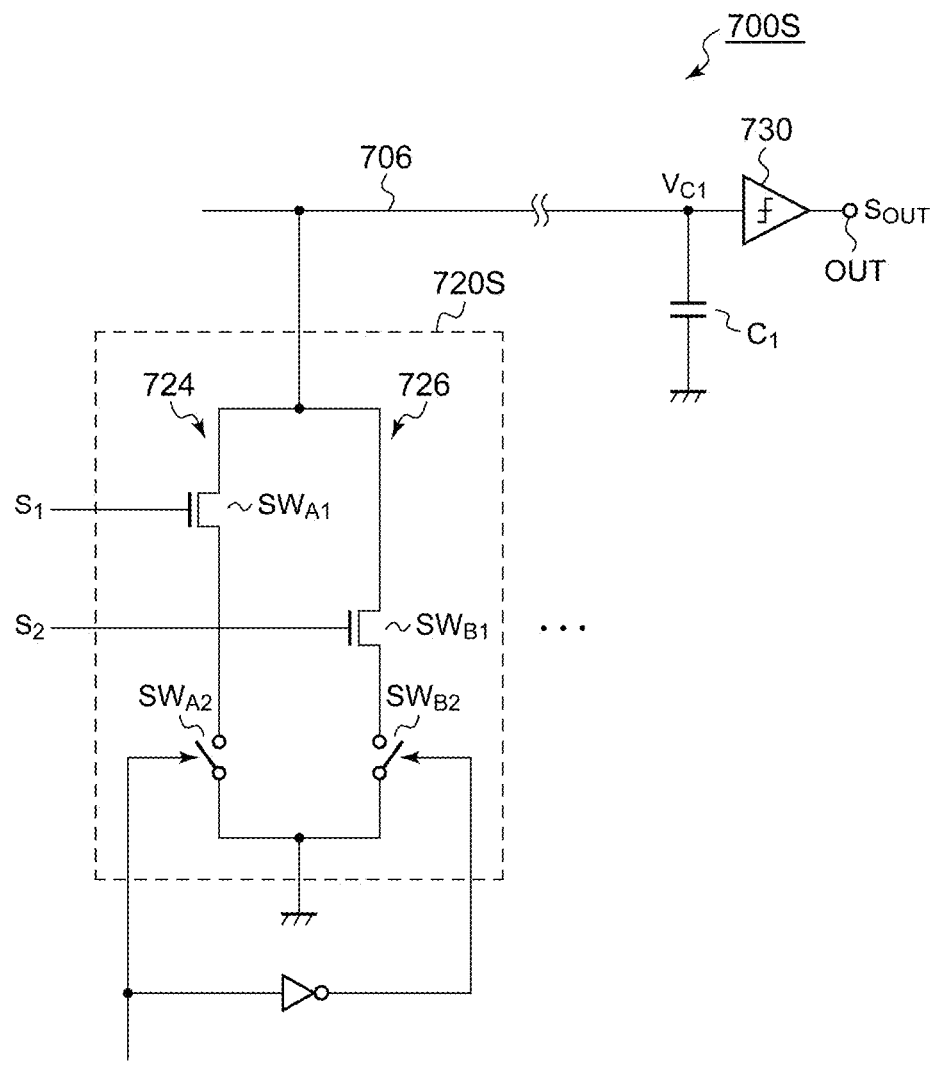
FIG. 11 is a simplified circuit diagram showing a phase interpolator according to a second comparison technique.

FIG. 11 is a simplified circuit diagram showing a phase interpolator 700S according to a second comparison technique. Each circuit unit 720S of the phase interpolator 700S has the same configuration as that of the phase interpolator 700R shown in FIG. 10 except that the current source CS is omitted. In the comparison technique, the impedance R of the first path 724 is defined as the sum total of the on resistances of the first switch $SW_{A1}$ and the switch $SW_{A2}$. The impedance R of the second path 726 is defined as the sum total of the on resistances of the first switch $SW_{B1}$ and the switch $SW_{B2}$.

In order to reduce the power consumption of the phase interpolator 700S, the impedance R is preferably raised so as to reduce the discharging current. However, with the phase interpolator 700S, in order to raise the on resistances of the switches $SW_{A1}$ and $SW_{A2}$ ($SW_{B1}$, $SW_{B2}$), each MOS transistor is required to have an increased gate length L. In a case in which the gate length is increased, this increases the gate capacitance of the MOS transistor. This lowers the slew rate of the gate voltage, leading to increased switching loss. Furthermore, this requires an increased gate driving current required to turn on or otherwise to turn off the switch. Accordingly, with the phase interpolator 700S shown in FIG. 11, there is a limit to a reduction in the power consumption.

Also, another method may be employed in which the charging/discharging current is adjusted based on the channel width W of each MOS transistor. However, in a case in which the channel width W is reduced in order to lower the current, this leads to an increase in variation, resulting in a drop in performance. In addition, the minimum value of the channel width W has a limitation in the manufacturing process. Accordingly, with such a method for designing the charging/discharging current based on only the parameters W and L of each MOSFET, it is difficult to support both low power consumption and high performance.

In contrast, with the phase interpolator 700 (700A or otherwise 700B or 700C described later), in a case in which the resistance value of each resistor $R_g$ is increased, there is no need to increase the gate lengths L of the switches $SW_{A1}$ through $SW_{A3}$ and $SW_{B1}$ through $SW_{B3}$. This allows the switching loss to be reduced. Furthermore, this arrangement allows the gate driving current to be reduced. In addition, there is no need to reduce the channel width W, thereby suppressing an increase in variation and degradation in performance due to the increased variation.

Second Example

Figure 12:
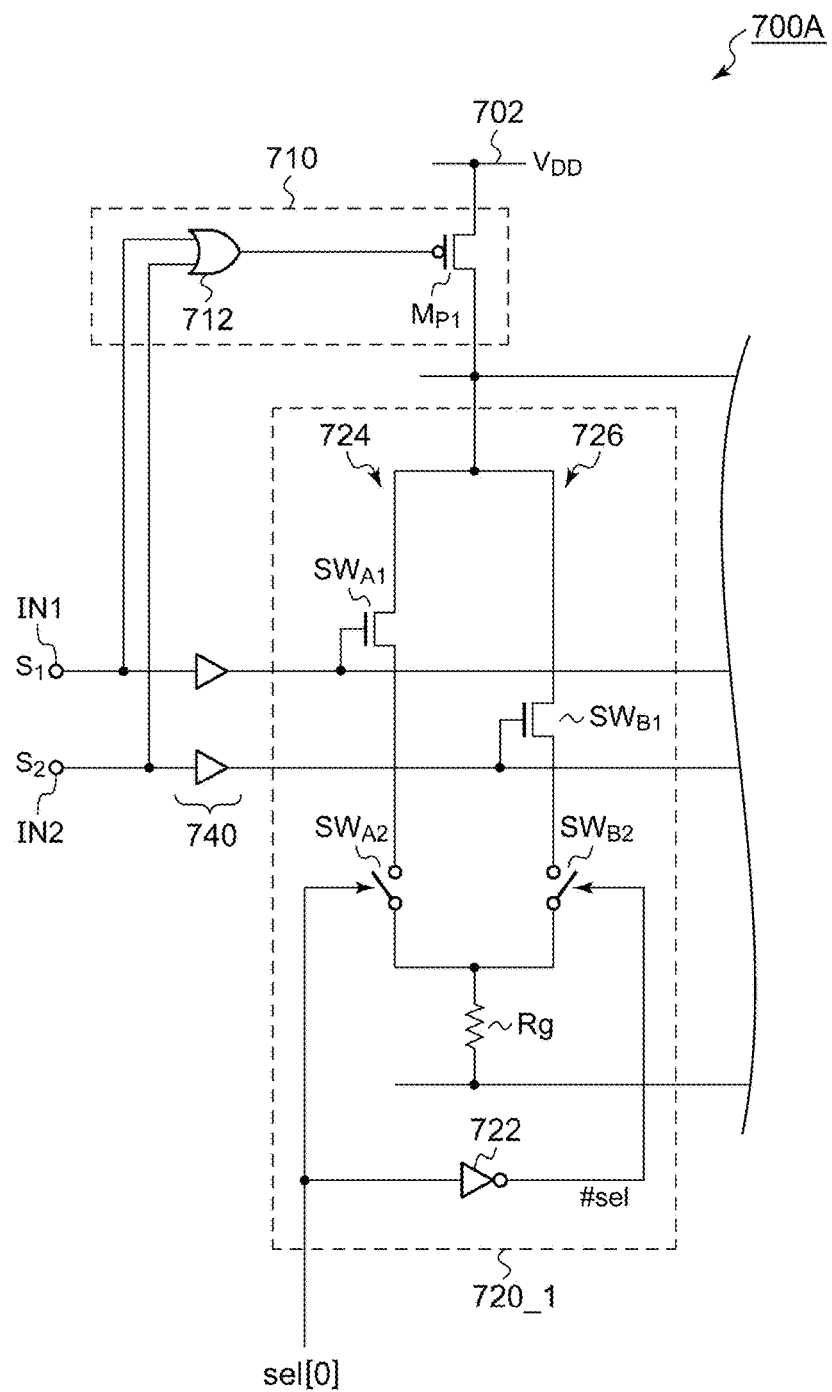
FIG. 12 is a circuit diagram showing the phase interpolator according to the first example.

FIG. 12 is a circuit diagram showing a phase interpolator 700B according to a second example. In this example, the third switches $SW_{A3}$ and $SW_{B3}$ on the intermediate line 706 side are omitted from the circuit unit 720 shown in FIG. 2. The other configuration is the same as that of the phase interpolator 700A. With the second example, this arrangement is capable of generating the output signal $S_{OUT}$ having a phase that corresponds to the control code. Furthermore, the second example has the same advantages as those described relating to the first example.

Third Example

Figure 13:
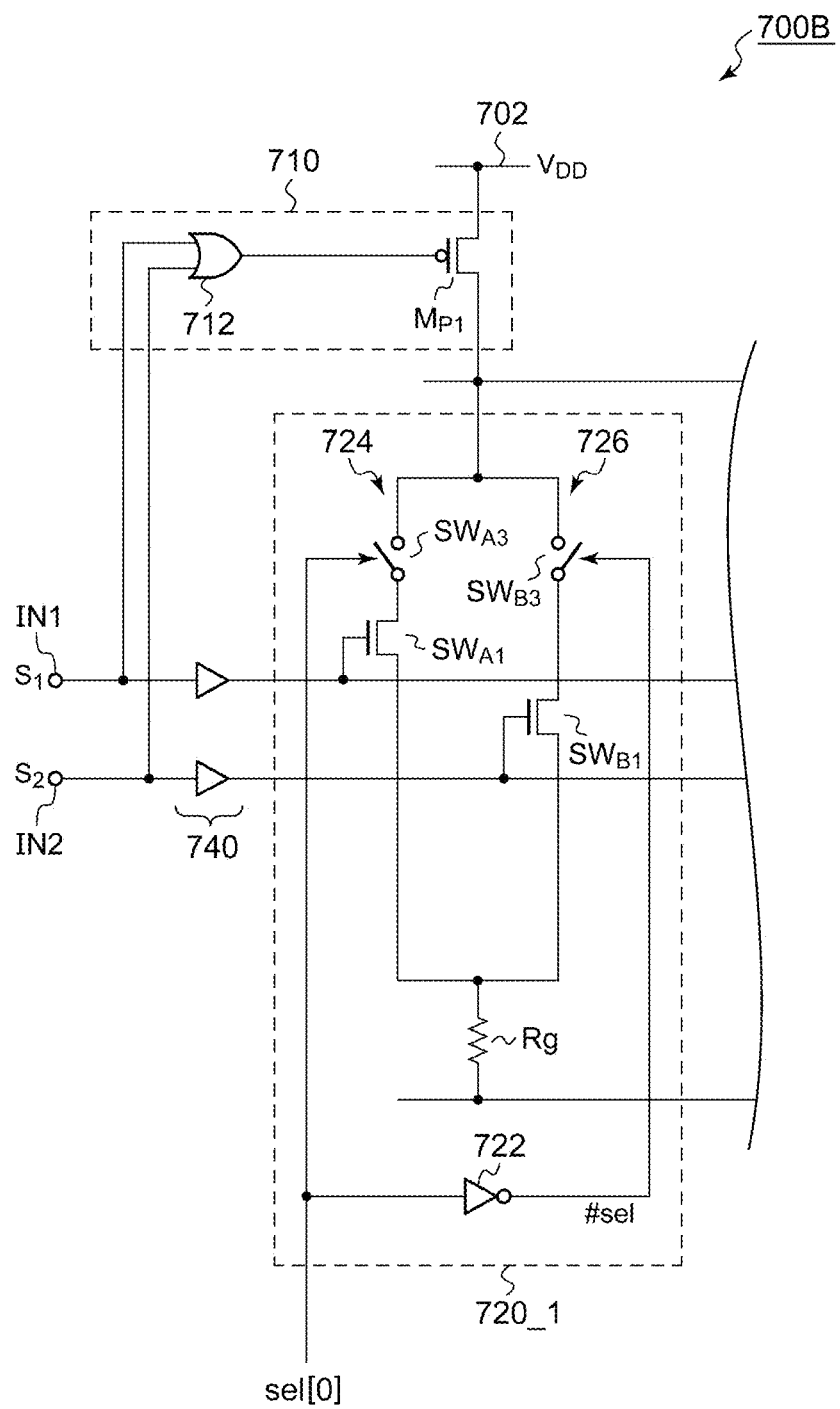
FIG. 13 is a circuit diagram showing the phase interpolator according to a second example.

FIG. 13 is a circuit diagram showing a phase interpolator 700C according to a third example. In this example, the circuit unit 720C has the same configuration as that shown in FIG. 2 except that the second switches $SW_{A2}$ and $SW_{B2}$ on the resistor $R_g$ side are omitted. The other configuration is the same as that of the phase interpolator 700A. With the third example, such an arrangement is also capable of generating the output signal $S_{OUT}$ having a phase that corresponds to the control code. Furthermore, the third example has the same advantages as those described relating to the first example.

Comparative Evaluation

Next, description will be made regarding a comparison of the characteristics of the phase interpolators 700A, 700B, and 700C according to the first example through the third example.

Figure 14A:
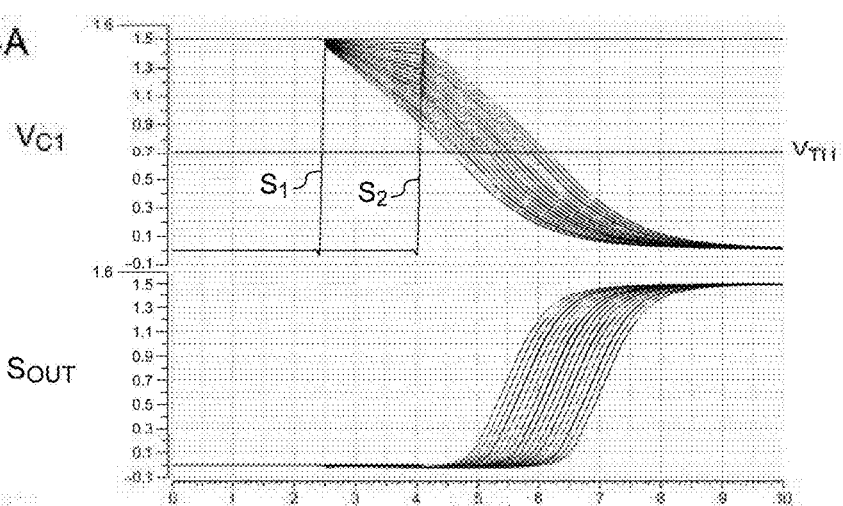
FIG. 14A through FIG. 14C are operation waveform diagrams respectively showing the operations of the phase interpolators according to the first through third examples.
Figure 14B:
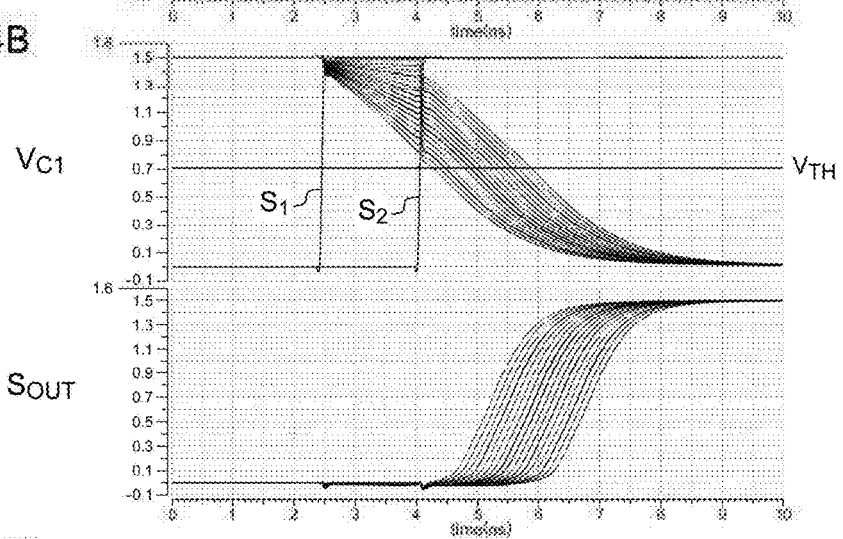
Figure 14C:
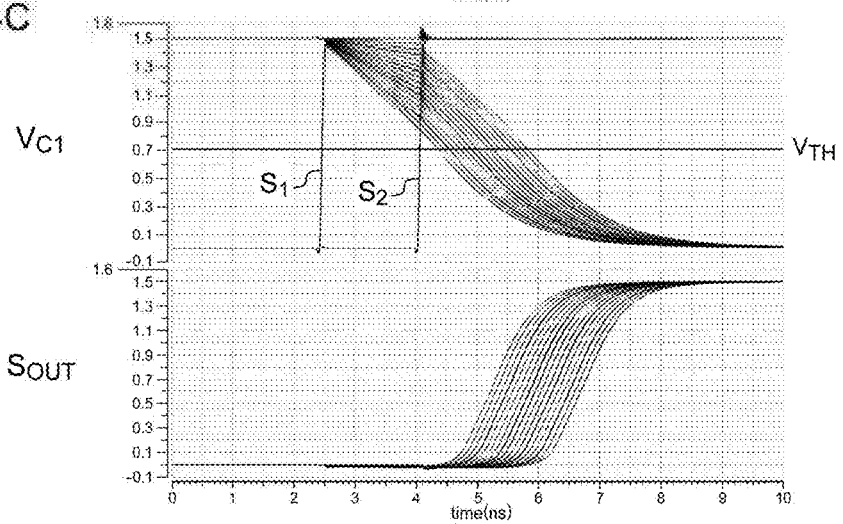

FIG. 14A through FIG. 14C are operation waveform diagrams showing the operations of the phase interpolators 700A through 700C according to the first example through the third example. FIG. 14A through FIG. 14C each show simulation results with $V_{DD}$=1.5 V, and with N=16. As can be understood from the comparison results shown in FIG. 14A through FIG. 14C, there is a difference in the behavior of the capacitor voltage $V_{C1}$ at a timing at which the first signal $S_1$ transits and at a timing at which the second signal $S_2$ transits.

Figure 15A:
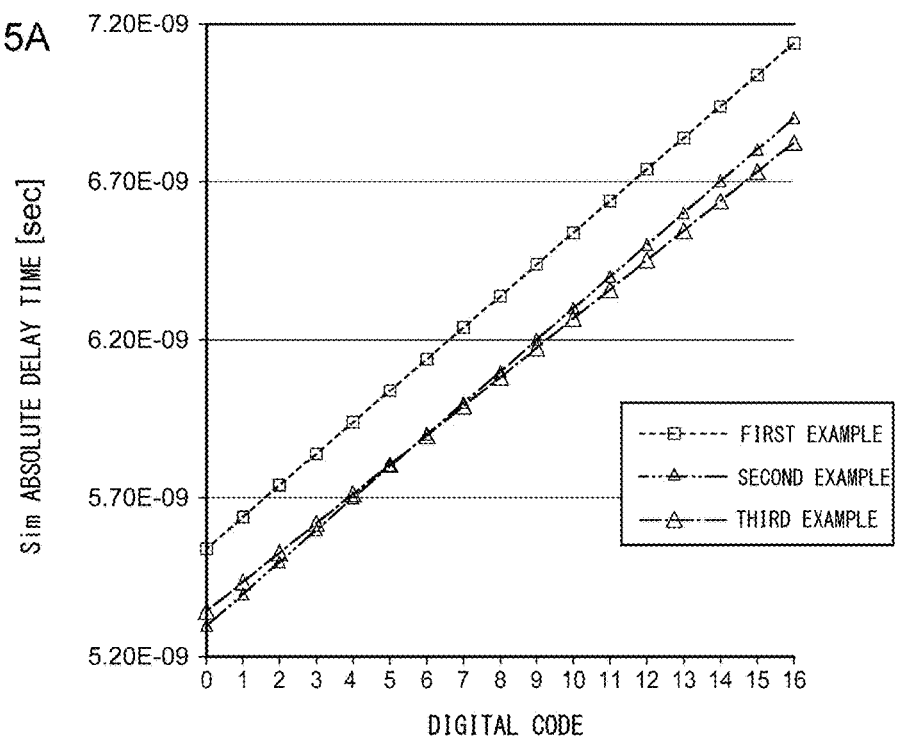
FIG. 15A and FIG. 15B are diagrams each showing the relation between the input code and the delay amount for the phase interpolators according to the first through third examples.
Figure 15B:
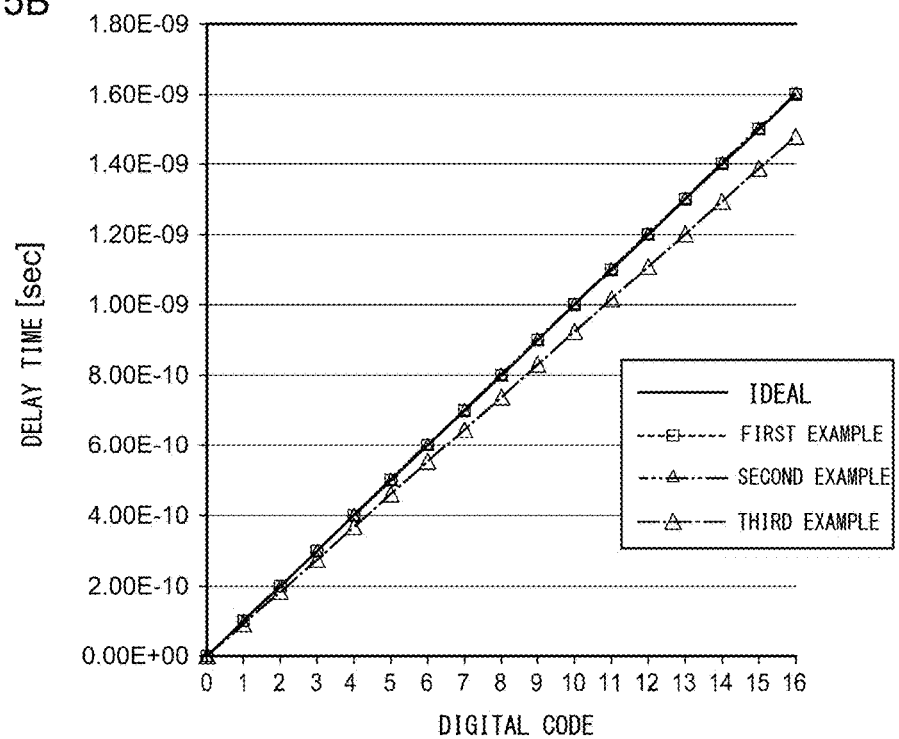

FIG. 15A and FIG. 15B are diagrams each showing the relation between the input code and the delay amount provided by the phase interpolators 700A through 700C according to the first example through the third example. FIG. 15B shows the relative delay time offset such that the delay amount is set to zero when the input code is zero.

Figure 16A:
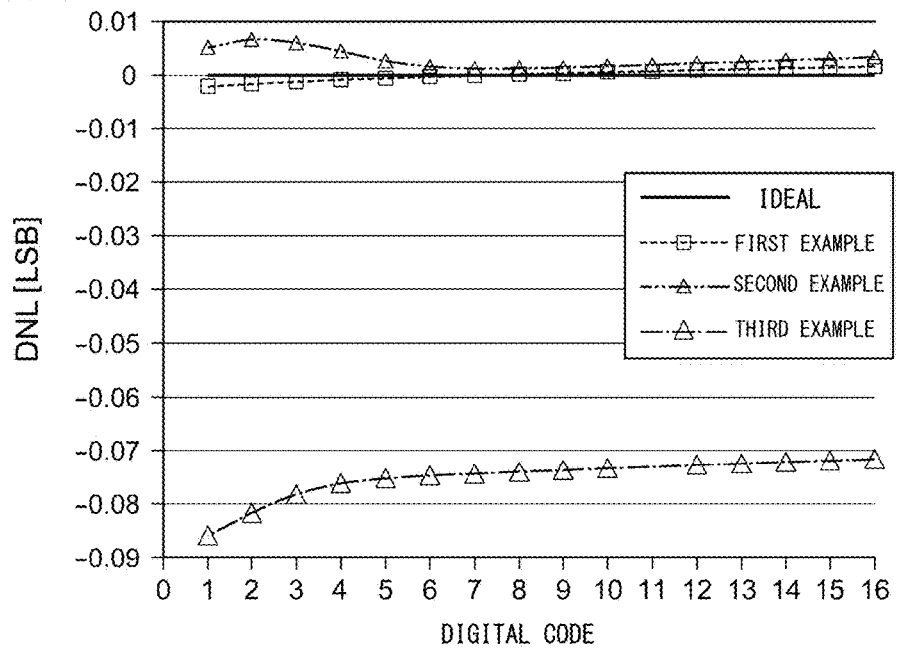
FIG. 16A is a diagram showing the DNL of the phase interpolators according to the first through third examples.
Figure 16B:
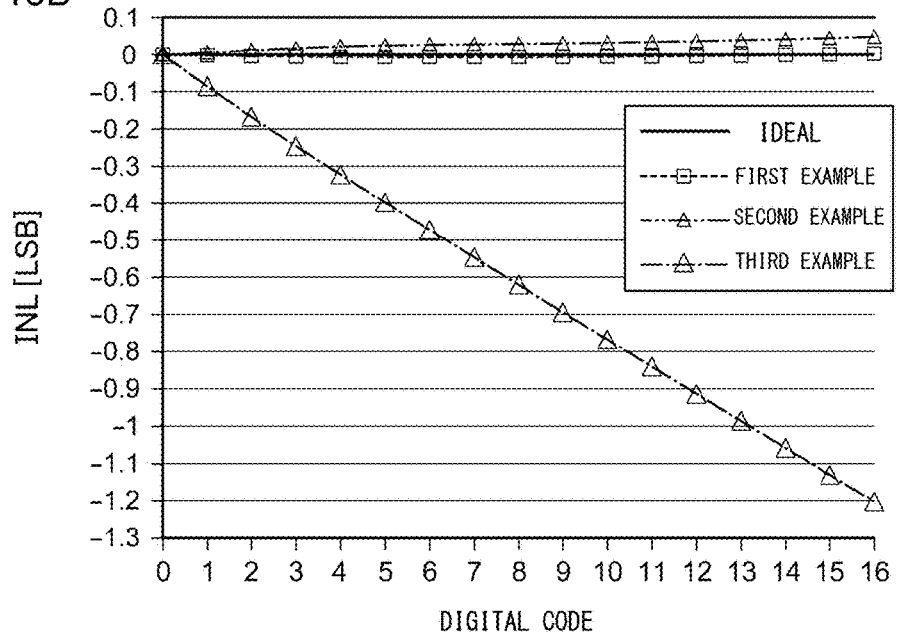
FIG. 16B is a diagram showing the INL of the phase interpolators according to the first through third examples.

FIG. 16A is a diagram showing the respective DNL for the phase interpolators 700A through 700C according to the first example through the third example. FIG. 16B is a diagram showing the respective INL for the phase interpolators 700A through 700C according to the first through third example.

Description will be made regarding the simulation results.

First Example

More specifically, referring to FIG. 14A relating to the first example 700A, the phase interpolator 700A according to the first example operates with a waveform that is closest to an ideal waveform as shown in FIG. 9. Directing attention to the first path 724 side, this is a result of the fact that by providing the switches $SW_{A2}$ and $SW_{A3}$ on both sides of the first switch $SW_{A1}$, this arrangement is capable of suppressing the effect of clock feedthrough and charge injection in the first switch $SW_{A1}$.

That is to say, this arrangement allows the switches $SW_{A2}$ and $SW_{A3}$ respectively arranged on the higher voltage side and the lower voltage side of the first switch $SW_{A1}$ to be turned off. This arrangement suppresses unnecessary or otherwise undesired charge to the intermediate line 706 due to the occurrence of clock feedthrough and charge injection in the first switch $SW_{A1}$, thereby suppressing unnecessary voltage variation.

Furthermore, this arrangement is capable of switching off the upper-side switch $SW_{A2}$ and the lower-side switch $SW_{A3}$. Accordingly, this arrangement is capable of suppressing unnecessary or undesired charge to a node between the switches $SW_{A1}$ and $SW_{A2}$ and to a node between the switches $SW_{A1}$ and $SW_{A3}$. This arrangement is capable of removing undesired effects on the voltage $V_{C1}$ at the intermediate line 706. The same can be said of the second path 726 side.

With the first example, as described above, this arrangement suppresses the effects of charge injection and clock feedthrough on the upper-side line and the lower-side line. Accordingly, as shown in FIG. 16A and FIG. 16B, this arrangement exhibits very favorable characteristics of the INL and DNL both being close to zero.

Second Example

As shown in FIG. 14B relating to the phase interpolator 700B according to the second example, the upper-side switch $SW_{A3}$ is omitted. Accordingly, unnecessary charge to the intermediate line 706 occurs due to the occurrence of clock feedthrough and charge injection in the first switch $SW_{A1}$, leading to variation of the capacitor voltage $V_{C1}$ (Effect 1).

Furthermore, because the upper-side switch $SW_{A3}$ is omitted, when the first switch $SW_{A1}$ is turned on, unnecessary or undesired charge occurs at a node between the switches $SW_{A1}$ and $SW_{A2}$, and unnecessary discharge is generated in the intermediate line 706 (Effect 2).

As can be understood from FIG. 16A, the second example involves a large deviation of the DNL when the code has a small value. As the code becomes larger, the deviation gradually becomes smaller. However, the actual DNL curve does not cross the ideal line over the entire range. Rather, the DNL rises again with an intermediate code (6 to 7) as a boundary. This is because the effect 1 and the effect 2 cancel each other out. However, the effect 1 is slightly larger than the effect 2. This leads to a slight increase in the delay. As a result, the DNL rises. The DNL is larger than the ideal value. Thus, the INL monotonically rises as shown in FIG. 16B.

Third Example

In FIG. 14C relating to the phase interpolator 700C according to the third example including the upper-side switch $SW_{3A}$, this arrangement suppresses the effect of clock feedthrough and charge injection on the intermediate line 706 due to the first switch $SW_{A1}$.

On the other hand, the phase interpolator 700C according to the third example has no lower-side switch $SW_{A2}$.

Accordingly, when the first switch $SW_{A1}$ is turned on, unnecessary charge occurs at a node between the switches $SW_{A1}$ and $SW_{A3}$. This charge leads to a reduction in the voltage at an upper-side node of the resistor $R_g$, leading to an increase in the gate-source voltage $V_g$, of the first switch $SW_{A1}$, which results in a reduction of the on resistance. This leads to a problem in that the intermediate line 706 is discharged at an excessively early timing.

As can be understood from FIG. 16A, the third example involves a large deviation of the DNL toward the negative side. This is because, unlike the second example, the discharging effect is large. Thus, as shown in FIG. 16B, the INL is greatly reduced.

As can be understood from the comparison results, it has been confirmed that the examples exhibit favorable characteristics in the order of the first example, the second example, and the third example. Accordingly, in a case in which a large number of circuit elements does not become a problem, the first example may preferably be employed. In contrast, in a case in which it is possible to compromise with respect to the characteristics, the second example may preferably be employed, thereby allowing the circuit area to be reduced. No reason is found for proactively employing the third example. However, even the third example may be sufficiently effective depending on the required performance.

Second Embodiment

Figure 17:
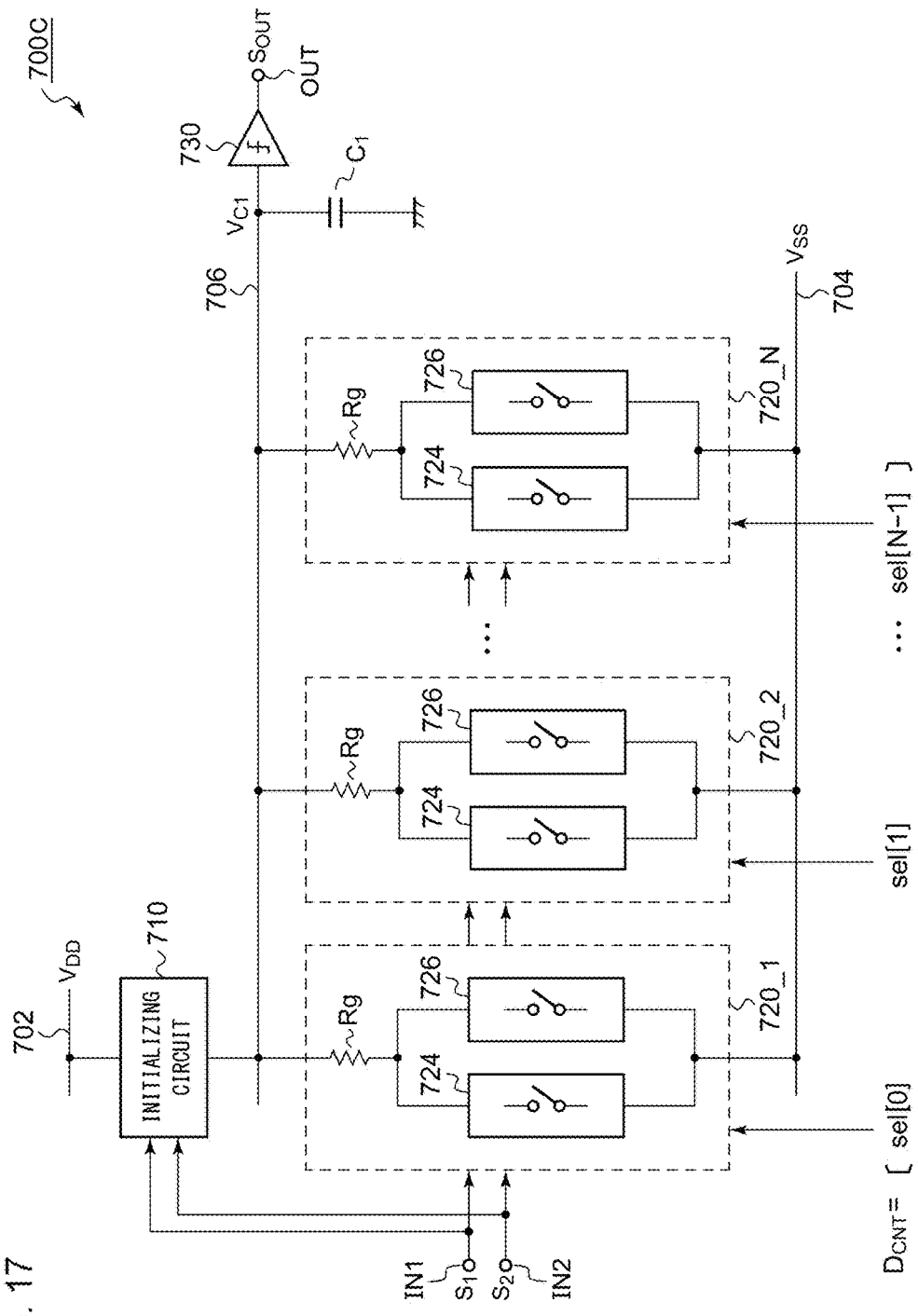
FIG. 17 is a circuit diagram showing a phase interpolator according to a second embodiment.

FIG. 17 is a circuit diagram showing a phase interpolator 700C according to a second embodiment. The phase interpolator 700C has the same configuration as that of the phase interpolator 700 (FIG. 1) according to the first embodiment except that the resistor $R_g$ is arranged at different position. Specifically, in the first embodiment, the resistor $R_g$ is arranged at a position that is closer to the second line 704 side than the first path 724. In contrast, in the phase interpolator 700C according to the second embodiment, the resistor $R_g$ is arranged at a position that is closer to the intermediate line 706 side than the first path 724. The phase interpolator 700C also provides the same advantages as those of the first embodiment.

Fourth Example

Figure 18:
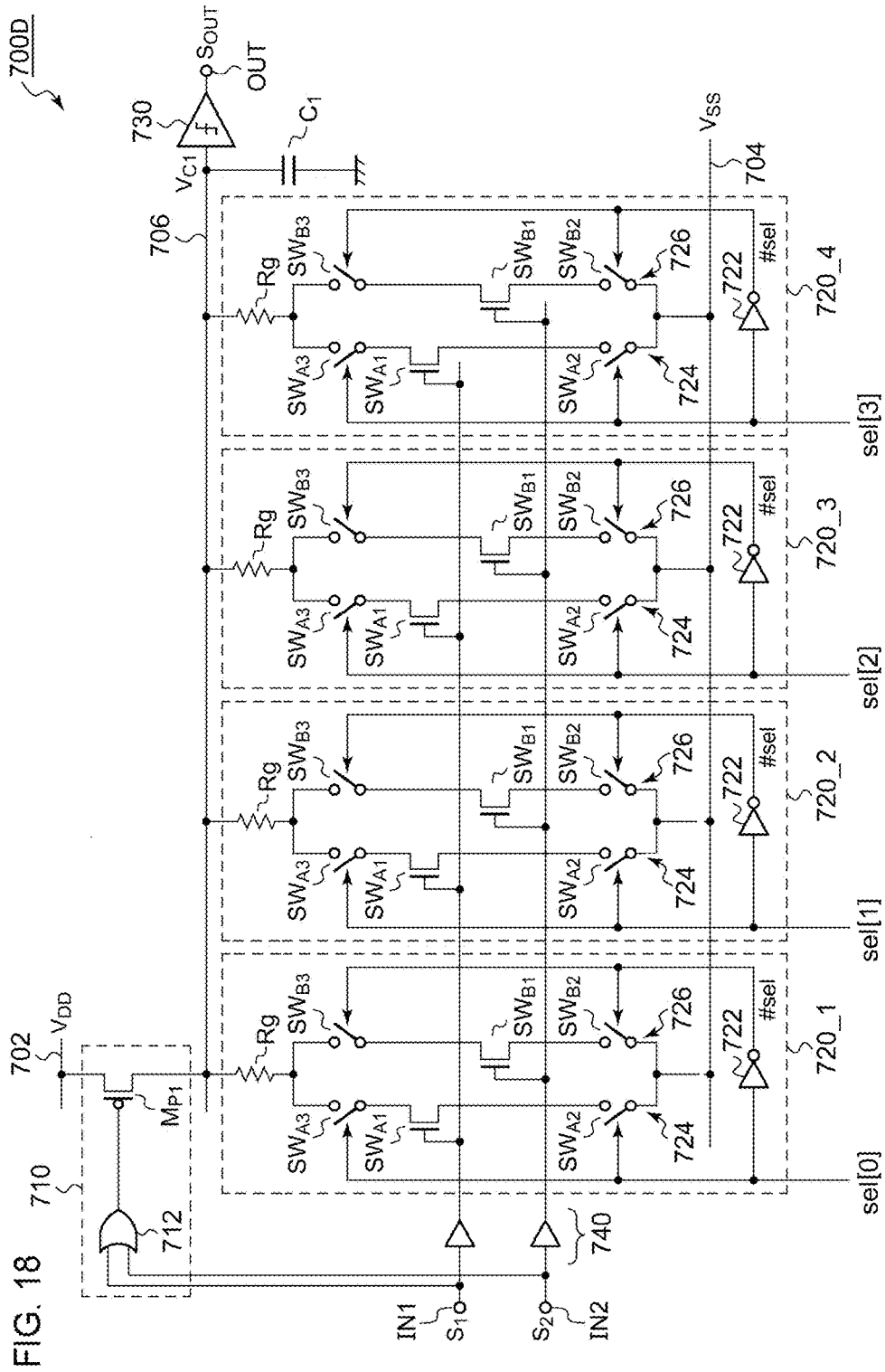
FIG. 18 is a circuit diagram showing a phase interpolator according to a fourth example.

Next, description will be made regarding a specific example configuration of a phase interpolator 700D according to a second embodiment. FIG. 18 is a circuit diagram showing a phase interpolator 700D according to a fourth example. In the phase interpolator 700D, the first path 724 and the second path 726 have the same configurations as those shown in FIG. 2. This arrangement is capable of suppressing the effects of clock feedthrough and charge injection, thereby allowing the DNL (Differential Non-Linearity) and INL (Integral Non-Linearity) to be reduced.

Fifth Example

Figure 19:
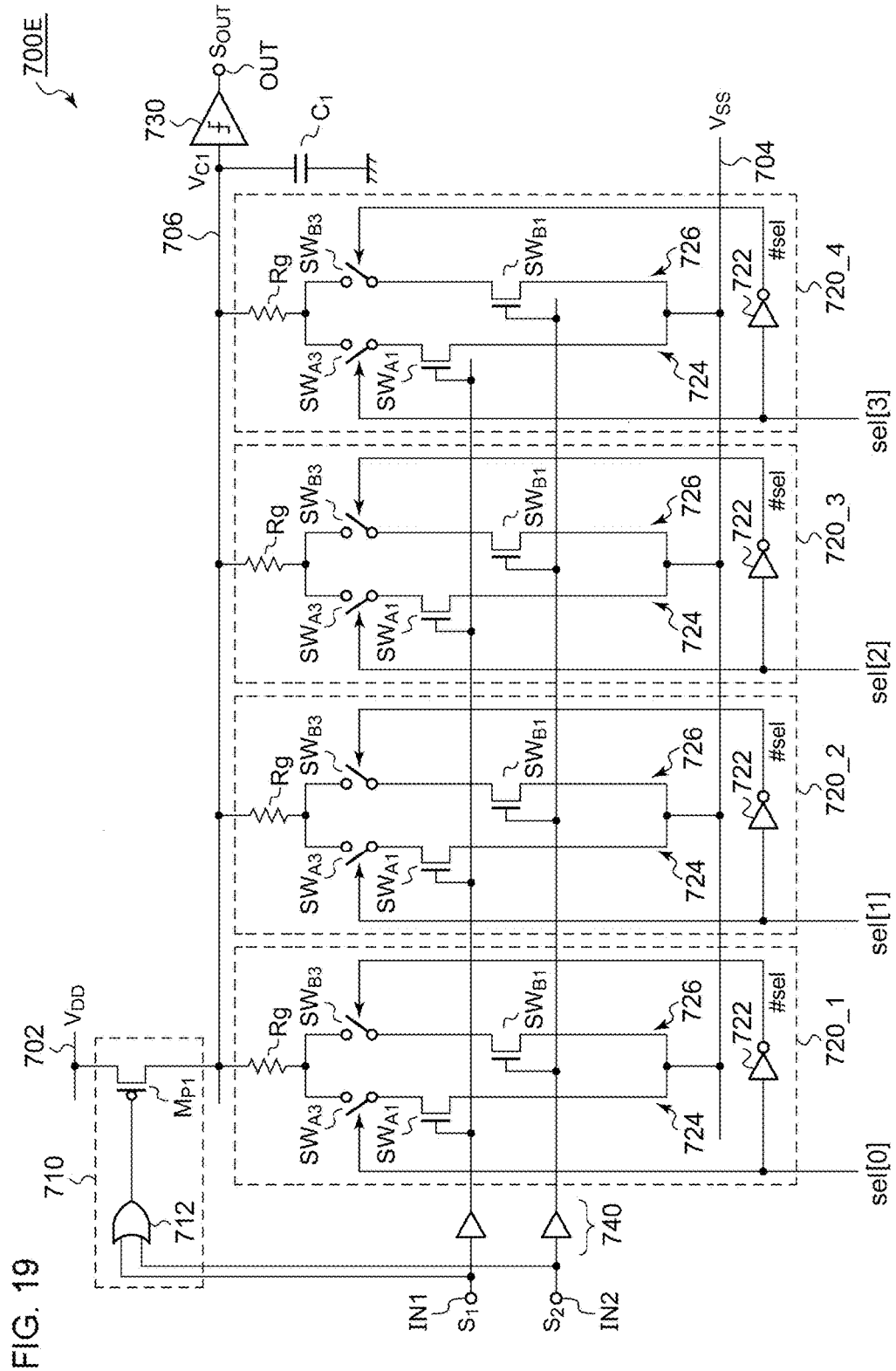
FIG. 19 is a circuit diagram showing a phase interpolator according to a fifth example.

FIG. 19 is a circuit diagram showing a phase interpolator 700E according to a fifth example. In the phase interpolator 700E, the switch $SW_{A2}$ on the second line 704 side is omitted from the first path 724, and the switch $SW_{B2}$ on the second line 704 side is omitted from the second path 726.

In the fifth example, the third switch $SW_{A3}$ is arranged between the first switch $SW_{A1}$ and the resistor $R_g$. The third switch $SW_{B3}$ is arranged between the first switch $SW_{B1}$ and the resistor $R_g$. Accordingly, by providing such third switches $SW_{A3}$ and $SW_{B3}$, this arrangement is capable of suppressing the effects of clock feedthrough and charge injection on the resistor side.

On the other hand, in a case in which the second line 704 is configured as a ground line (or otherwise a power supply line), the impedance of the second line 704 is sufficiently low. Accordingly, even if the charge injection or clock feedthrough occurs on the source side of the first switch $SW_{B1}$ or on the source side of the second switch $SW_{A2}$, the change in electric potential at the second line 704 can be ignored. Accordingly, this arrangement provides the same level of improved DNL and INL as those provided by the fourth example while omitting the second switches $SW_{A2}$ and $SW_{B2}$. That is to say, the fifth example allows the number of transistors to be reduced, thereby allowing the circuit area to be reduced.

Third Embodiment

Figure 20:
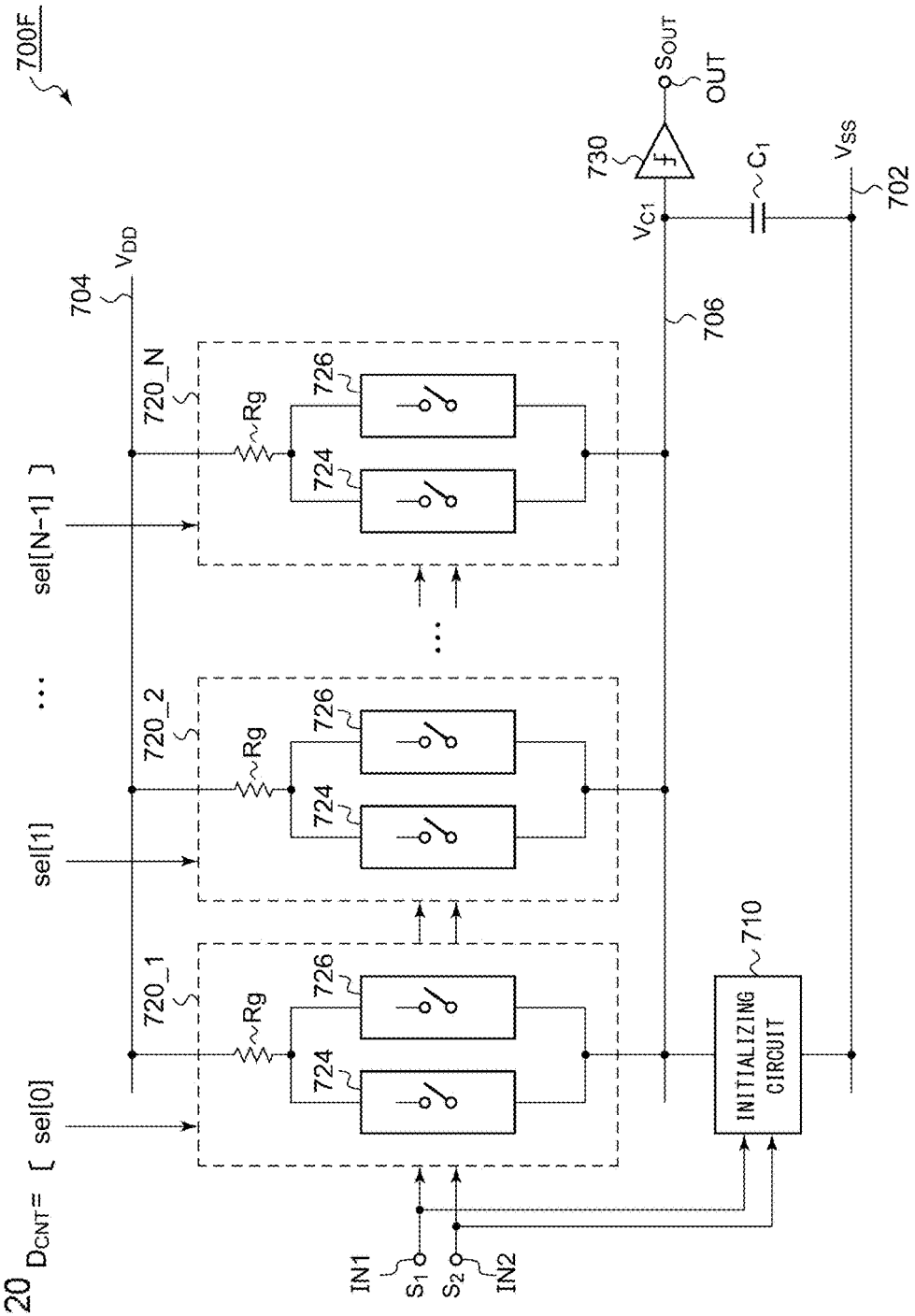
FIG. 20 is a circuit diagram showing a phase interpolator according to a third embodiment.

FIG. 20 is a circuit diagram showing a phase interpolator 700F according to a third embodiment. The first and second embodiments are designed directing attention to the phase of the positive edges of the first signal $S_1$ and the second signal $S_2$. In contrast, with the third embodiment, this arrangement operates using a negative edge (falling edge or trailing edge) as a trigger. The phase interpolator 700F has a configuration obtained by electrically reversing the configuration of the phase interpolator 700 shown in FIG. 1.

Sixth Example

Figure 21:
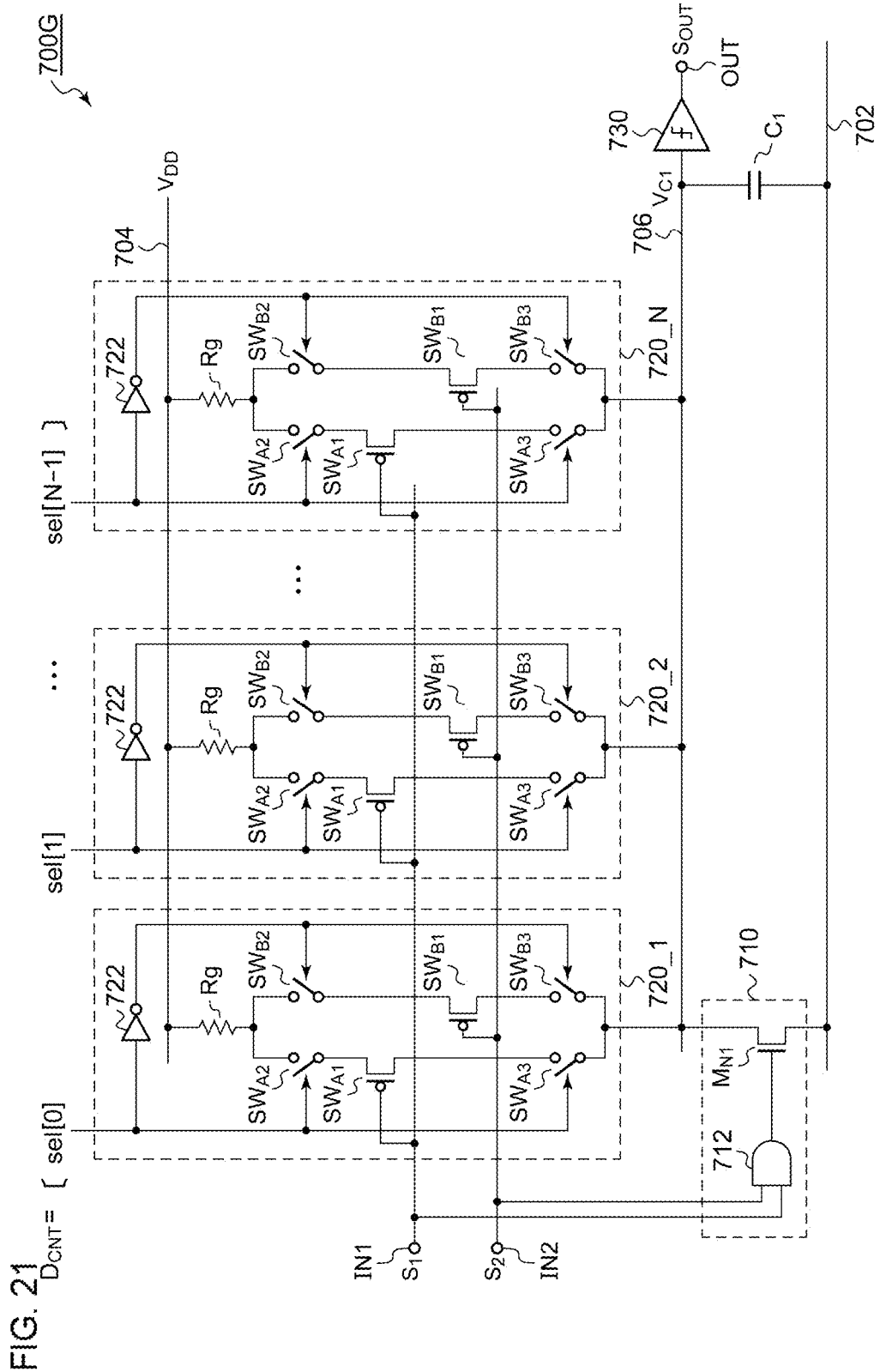
FIG. 21 is a circuit diagram showing a phase interpolator according to a sixth example.

FIG. 21 is a circuit diagram showing a phase interpolator 700G according to a sixth example. In each circuit unit 720, the first path 724 and the second path 726 respectively include three switches, i.e., $SW_{A1}$ through $SW_{A3}$ and $SW_{B1}$ through $SW_{B3}$, as with the first example. Each switch is configured as a PMOS transistor.

The initializing circuit 710 includes an initializing transistor $M_{N1}$ configured as an NMOS transistor and a logic gate 712. In this example, the logic gate 712 is configured as an AND (logical AND) gate.

Figure 22:
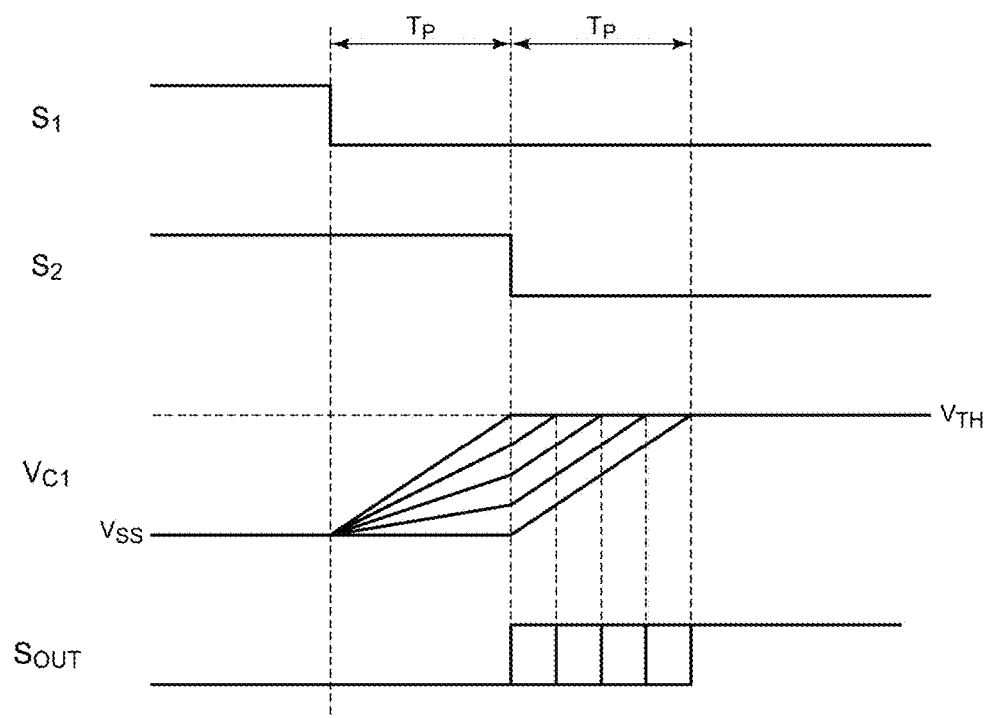
FIG. 22 is an operation waveform diagram showing the operation of the phase interpolator shown in FIG. 21.

FIG. 22 is an operation waveform diagram showing the operation of the phase interpolator 700G shown in FIG. 21. The phase interpolator 700G shown in FIG. 21 provides a variation employing a negative edge as a trigger. It should be noted that, in FIG. 21, the switches $SW_{A3}$ and $SW_{B3}$ may be omitted from the phase interpolator 700G shown in FIG. 21. Alternatively, in FIG. 21, the switches $SW_{A2}$ and $SW_{B2}$ may be omitted from the phase interpolator 700G shown in FIG. 21.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

An arrangement obtained by electrically reversing the configuration of the second embodiment (FIG. 17 through FIG. 19) and mutually exchanging each P-channel element and the corresponding N-channel element is also effective as an embodiment of the present invention.

Also, such a resistor $R_g$ may be inserted on both the upper side and the lower side of the first path 724. Also, such a first path 724 may be coupled in parallel with the second path 726.

In a case in which the control code $D_{CNT}$ is supplied as an M-bit binary code, the control code $D_{CNT}$ may preferably be expanded to the multiple bits sel[0] through sel[N−1]. In order to provide such a function, a decoder configured to convert a binary code into a thermometer code may be employed. Also, as a simple method, the following processing may be performed. For example, in a case in which M=3, this arrangement supports a control operation with the number of levels represented by $N=2^M=8$. In this case, the bits sel[0] through sel[3] may each be set to the MBS (Most Significant Bit) of the binary code. The bits sel[4] and sel[5] may each be set to the second bit of the binary code. The bit sel[6] may be set to the LSB (Least Significant Bit) of the binary code.

Usage

Next, description will be made regarding the usage of the phase interpolator. The phase interpolator described above may be employed as a timing generator. First, description will be made with reference to FIG. 23 and FIG. 24 regarding the function and the configuration of a known timing generator. In the present specification, a circuit configured to generate a desired timing (phase) will be referred to as the "timing generator".

Figure 23A:
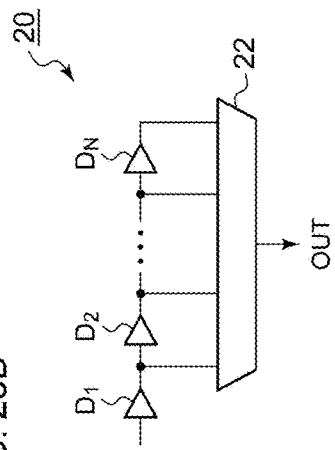
FIG. 23A through FIG. 23C are circuit diagrams each showing a conventional timing generator.
Figure 23B:
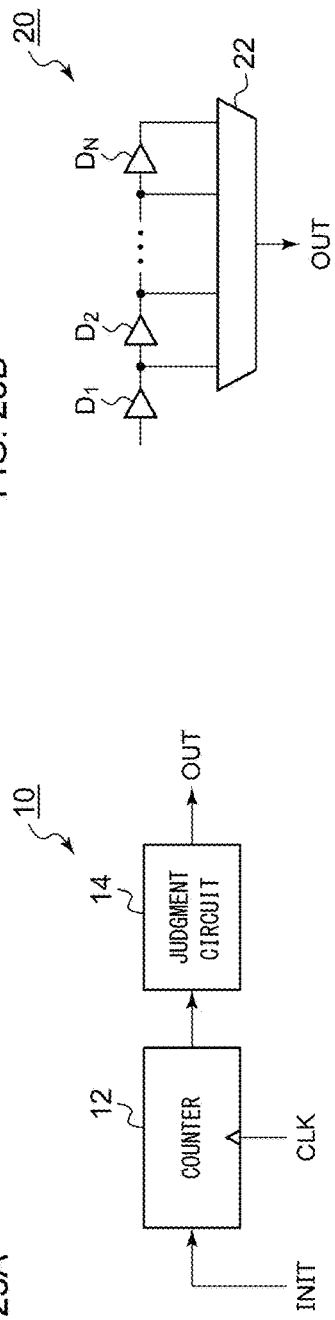
Figure 23C:
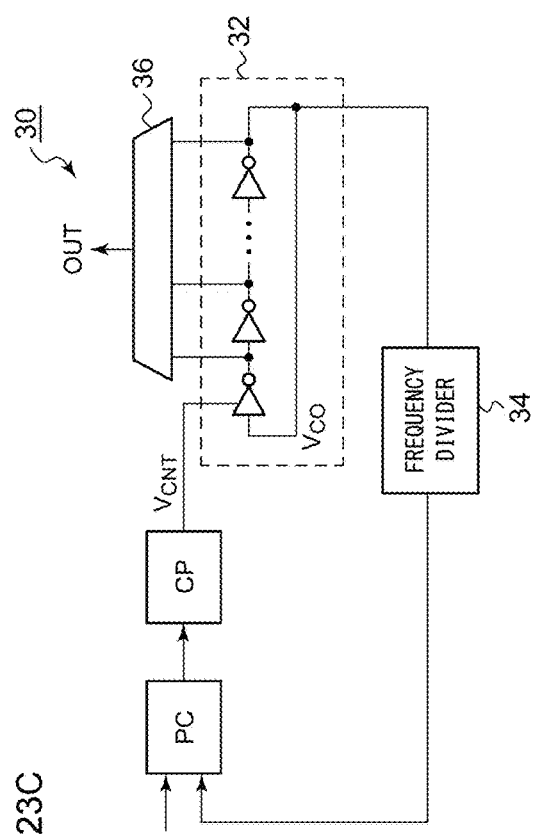

FIG. 23A through FIG. 23C are circuit diagrams each showing a conventional timing generator. A timing generator 10 shown in FIG. 23A includes a digital counter 12 and a judgment circuit 14. The counter 12 is set to an initial value INIT that corresponds to a target timing. Upon activating the counter 12 at a reference timing, the counter 12 starts a counting operation. When the count value of the counter 12 becomes a predetermined value, the judgment circuit 14 changes the output OUT. The output signal OUT is configured as a signal with a delay of ($T_{CK}$×INIT) from the reference timing. The timing generator 10 has a time resolution of $T_{CK}$, which is limited by the frequency of the clock signal CLK supplied to the counter 12.

A timing generator 20 shown in FIG. 23B includes multiple delay elements (buffers) $D_1$ through $D_N$ coupled in series and a selector 22 that selects one from among output taps provided to the multiple delay elements. The time resolution provided by such a configuration is limited by the delay time $\tau_d$ provided by each delay element. The delay time $\tau_d$ greatly changes due to manufacturing variation, temperature, and power supply voltage conditions. Typically, in order to stabilize the delay time $\tau_d$, a feedback loop is constructed.

A timing generator 30 shown in FIG. 23C includes a PLL (Phase Locked Loop) circuit. The PLL circuit includes a phase comparator PC, a charge pump CP, a VCO (Voltage Controlled Oscillator) 32, and a frequency divider 34. The VCO 32 includes a ring oscillator. By selecting one from among multiple taps provided to the ring oscillator by means of a selector 36, this arrangement is capable of selecting a desired clock. The timing generator 30 shown in FIG. 23C involves a large circuit area, and involves large power consumption. Furthermore, this arrangement requires a predetermined period of time to stabilize the feedback loop, leading to a problem of a long startup time.

Figure 24A:
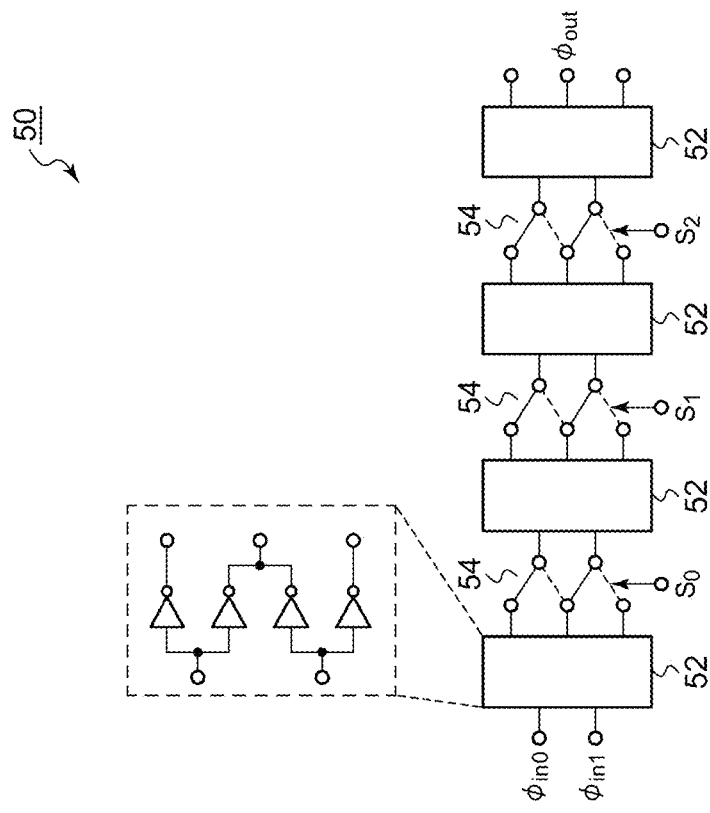
FIG. 24A and FIG. 24B are circuit diagrams each showing a timing generator employing a conventional phase interpolator.
Figure 24B:
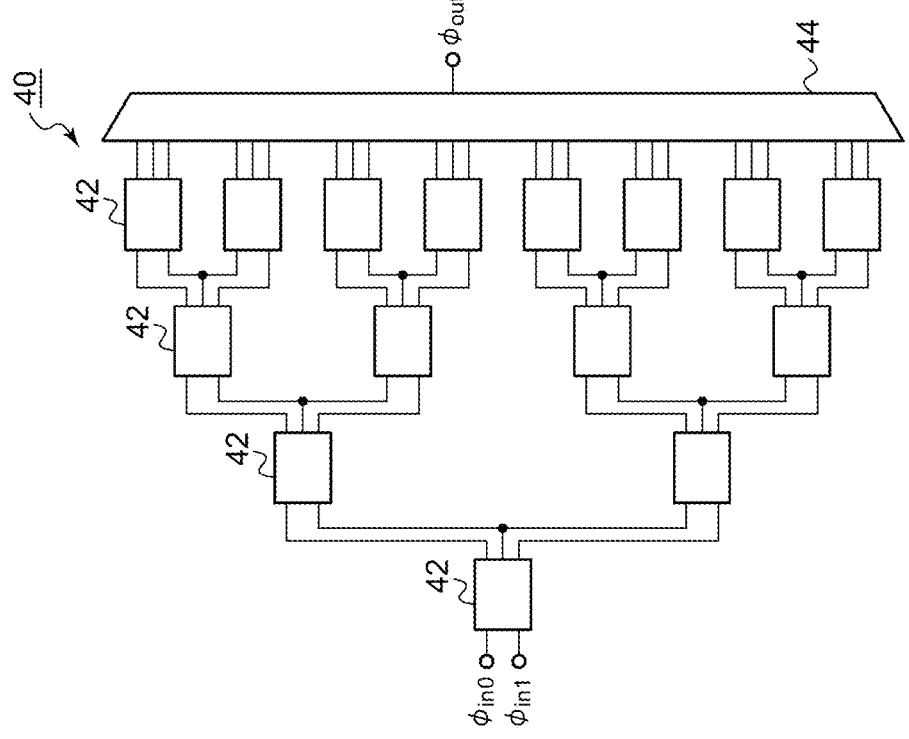

In a case of employing any one of the timing generators shown in FIG. 23A through FIG. 23C, the upper limit of the operation speed or otherwise the minimum delay provided by an application circuit employing such a timing generator is limited by the timing generator. In order to solve such a problem, as another approach, a circuit employing a phase interpolator (PI: Phase Interpolator) has bee proposed. (Non-patent document 1: Aravind Tharayil Narayanan et al., "A Fractional-N Sub-Sampling PLL using a Pipelined Phase-Interpolator With an FoM of 0.250 dB", IEEE JOURNAL OF SOLID-STATE CIRCUITS, VOL. 51, NO. 7, JULY 2016). Non-patent document 1 discloses a circuit configuration in which two-input or three-input phase interpolators (which will also be referred to as "phase blenders") are coupled so as to form a multi-stage circuit configuration. FIG. 24A and FIG. 24B are circuit diagrams each showing a timing generator employing conventional phase interpolators. A timing generator 40 shown in FIG. 24A is formed of multiple phase interpolators 42 arranged in a tournament-type configuration. Such a configuration requires ($2 \times 2^M - 1$) multiple phase interpolators 42 to provide M-bit ($2^M$-level) resolution, leading to a very large circuit area. Furthermore, such an arrangement requires a multiplexer 44 to select one from among $2^M$ multiple phase outputs $\phi_{OUT}$ generated with different respective timings. Moreover, the remaining phase interpolators 42 other than particular interpolators 42 that contribute to the output in the final stage also operate. This means that wasted electric power is consumed.

A timing generator 50 shown in FIG. 24B has a pipeline configuration including multiple pairs of a phase interpolator 52 and a multiplexer 54 coupled in series. With this method, such an arrangement requires only (M+1) multiple phase interpolators 52 and the M multiple multiplexers 54 to provide M-bit ($2^M$-level) resolution. Accordingly, this arrangement allows the circuit area to be greatly reduced as compared with the timing generator 40 shown in FIG. 24A.

The phase interpolator according to the embodiment can be employed in a conventional timing generator. Such a conventional timing generator has the following problems. As a result of investigating the timing generator 50 shown in FIG. 24B, the present inventor has come to recognize the following problem. With the timing generator 50 shown in FIG. 24B, an intermediate signal passes through the multiplexer (analog switch) 54.

Each multiplexer 54 selects one from among two signal paths for every operation. This arrangement requires the two signal paths to be selected to have entirely the same delay amount. In other words, the linearity of the timing control operation of the timing generator 50 (i.e., the effective time resolution) is limited by variation in the delay amount provided by the multiplexer 54.

In addition, when the pulse signal passes through the multiplexer, this leads to the occurrence of waveform distortion. Such waveform distortion causes degradation of the linearity of the timing control operation of the timing generator 50.

Furthermore, for every increase of one bit in the time resolution, such an arrangement requires one additional pair of the phase interpolator 52 and the multiplexer 54 to be provided. This means that there is a tradeoff relation between every one bit of improvement of the time resolution and an increase in variation of the delay amount. Such a tradeoff relation imposes a great limitation on the improvement of the time resolution.

Description will be made below regarding a higher-precision timing generator than those according to conventional techniques.

Figure 25:
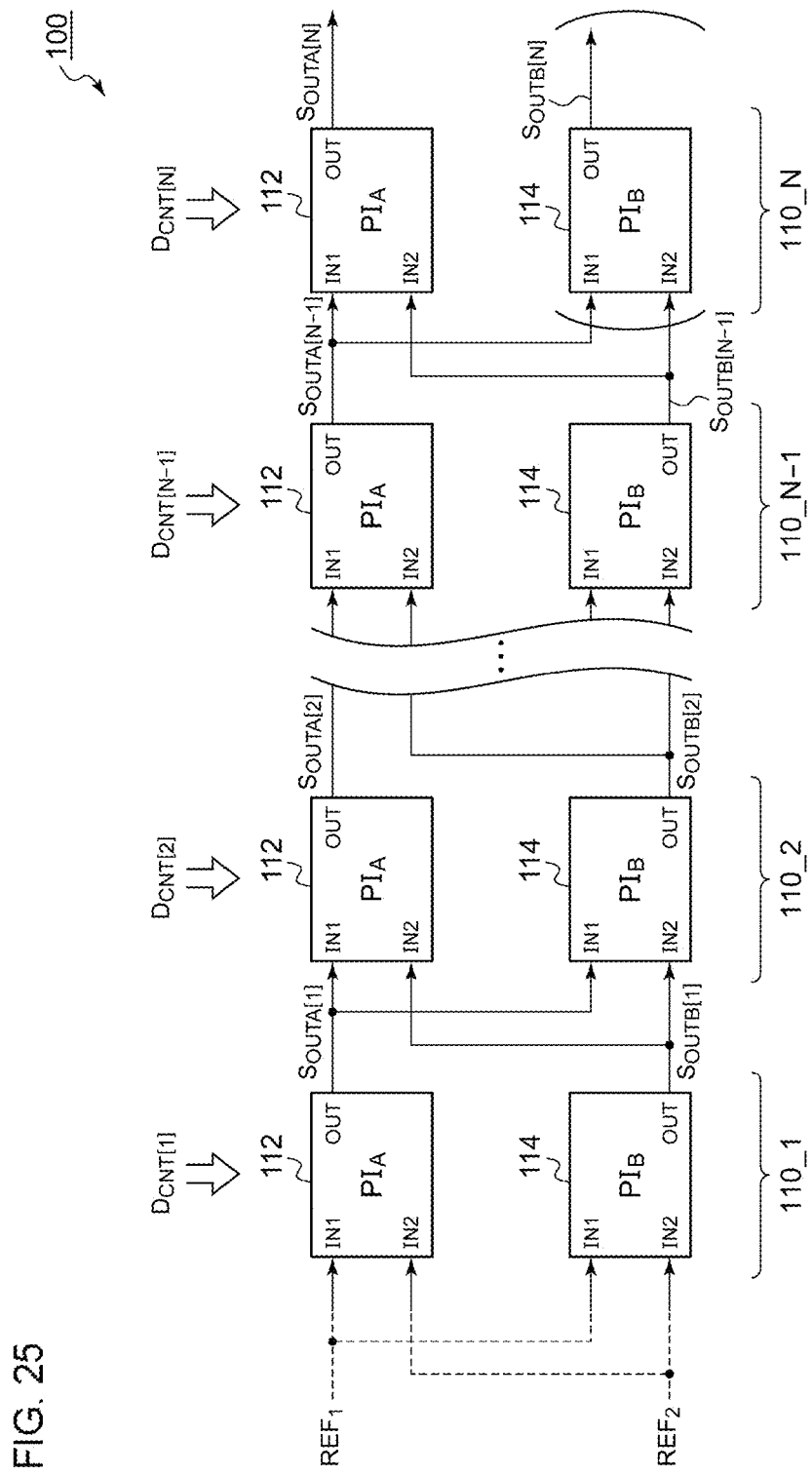
FIG. 25 is a block diagram showing a timing generator according to an embodiment.

FIG. 25 is a block diagram showing a timing generator 100 according to the embodiment. The timing generator 100 is configured as a combination of multiple phase interpolators PI.

Each phase interpolator PI includes two input nodes IN1 and IN2 and a single output node OUT. The two input nodes IN1 and IN2 respectively receive, as input signals, a first signal $S_1$ having an edge at a first timing $\phi_A$ and a second signal $S_2$ having an edge at a second timing $\phi_B$. The phase interpolator PI generates an output signal having an edge at a timing $\phi_{OUT}$ that corresponds to the control data, and outputs the output signal thus generated via the output node OUT. For ease of understanding, description will be made assuming that the first timing $\phi_A$ precedes the second timing $\phi_B$.

Figure 26:
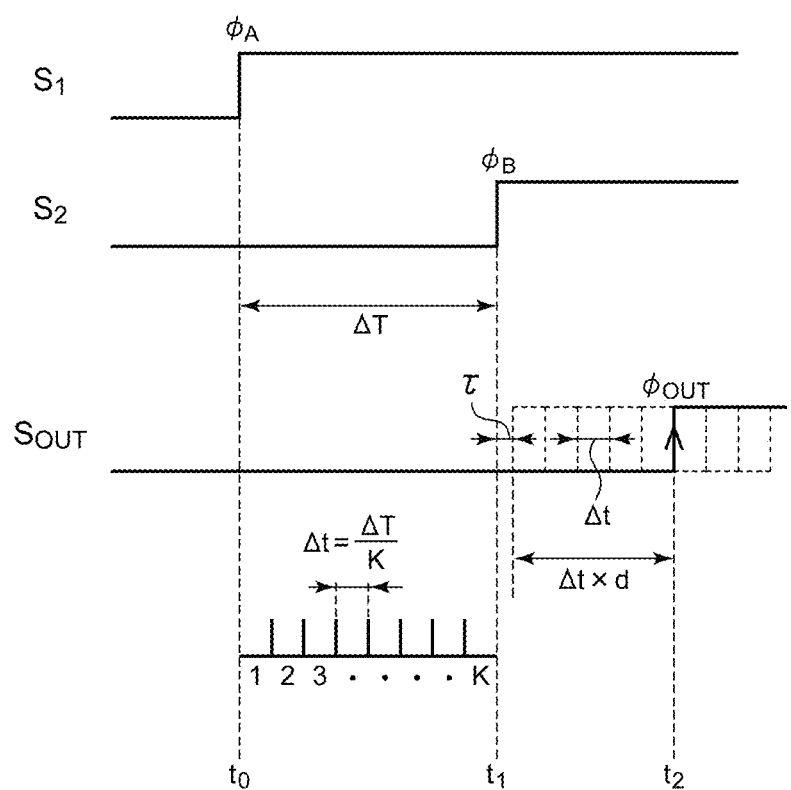
FIG. 26 is a diagram for explaining the basic operation of the phase interpolator.

FIG. 26 is a diagram for explaining the basic operation of the phase interpolator PI. At the time point $t_0$, an edge occurs in the first signal $S_1$ input to the input node IN1. At the time point $t_1$ after a predetermined time $\Delta T$ elapses from the time point $t_0$, an edge occurs in the second signal $S_2$ input to the input node IN2. With the number of interpolation levels of the phase interpolator PI as K (K≥2), the time resolution $\Delta t$ is represented by $\Delta T/K$. The control data $D_{CNT}$ is supplied to the phase interpolator PI. With the value of the control data $D_{CNT}$ as a decimal number d, the time point $t_2$ (output timing $\phi_{OUT}$) at which an edge occurs in the output signal $S_{OUT}$ is represented by the following Expression.

$$t_2 = t_1 + \tau + d \times \Delta t$$

Here, $\tau$ represents a predetermined offset delay amount, and the relation $\tau \geq 0$ holds true.

The configuration of the phase interpolator PI is not restricted in particular. Known techniques may be employed. Also, a configuration described later may be employed.

Returning to FIG. 25, the timing generator 100 includes N (N≥2) multiple stages 110_1 through 110_N. Each stage 110 includes a first phase interpolator (which will be referred to as a "main interpolator" hereafter) 112 and a second phase interpolator (which will be referred to as an "auxiliary interpolator") 114.

The output node OUT of the main interpolator 112 in the i-th (1≤i≤N−1) stage 110_i is coupled to the first nodes IN1 of the main interpolator 112 and the auxiliary interpolator 114 in the (i+1)-th stage 110_(i+1). Furthermore, the output node OUT of the auxiliary interpolator in the i-th (1≤i≤N−1) stage 110_i is coupled to the second nodes IN2 of the main interpolator 112 and the auxiliary interpolator 114 in the (i+1)-th stage 110_(i+1).

Two reference signals $REF_1$ and $REF_2$ may be supplied to the main interpolator 112 and the auxiliary interpolator 114 in the first stage 110_1 as indicated by the dashed line. An edge in the reference signal $REF_2$ occurs with a delay of a predetermined time $\Delta T_0$ with respect to the edge of the other reference signal $REF_1$.

Each stage may provide a different number of interpolation levels K. Of course, all the stages may provide the same number of interpolation levels.

The control data $D_{CNT[i]}$ is supplied to each stage 110. The main interpolator 112 generates an output signal $S_{OUTA[i]}$ having an edge that occurs at a timing $\phi^{OUTA[i]}$ that corresponds to the value $d_i$ of the control data $D_{CNT[i]}$.

On the other hand, the auxiliary interpolator 114 generates an output signal $S_{OUTB[i]}$ having an edge that occurs at a timing $\phi_{OUTB[i]}$ with a predetermined delay $\Delta T_{[i]}$ from the timing $\phi_{OUTA[i]}$ provided by the main interpolator 112.

The values $d_{A[i]}$ and $dB_{[i]}$ that correspond to the control data $D_{CONT[i]}$ are supplied to the main interpolator 112 and the auxiliary interpolator 114, respectively.

For example, in a case in which the main interpolator 112 and the auxiliary interpolator 114 have the same configuration, the codes to be supplied to the main interpolator 112 and the auxiliary interpolator 114 may be designed such that they have a predetermined difference $J_{[i]}$, as represented by the following Expressions.

$$d_{A[i]} = d_i$$

$$d_{B[i]} = d_i + J_i$$

Here, $J_{[i]}$ represents a constant, which is preferably set to 1. Also, a desired different value may be employed. The delay time $\Delta T_{[i]}$ is represented by the following Expression.

$$\Delta T_{[i]} = \Delta t_{[i-1]} \times J_{[i]}$$

Description will be made below regarding an example in which $J_{[i]} = 1$, and the delay time $\Delta T_{[i]}$ is equal to the time resolution $\Delta t_{[i]}$. In this case, the following expression holds true.

$$\Delta t_{[i]} = \Delta t_{[i-1]} / K_i$$

Alternatively, the circuit configurations of the main interpolator 112 and the auxiliary interpolator 114 may be modified such that a predetermined delay time $\Delta T_{[i]}$ is generated when the same value $d_i$ is supplied to the main interpolator 112 and the auxiliary interpolator 114.

In the N-th stage 110_N, either the main interpolator 112 or the auxiliary interpolator 114 may be omitted. This allows the circuit area to be reduced.

Figure 27:
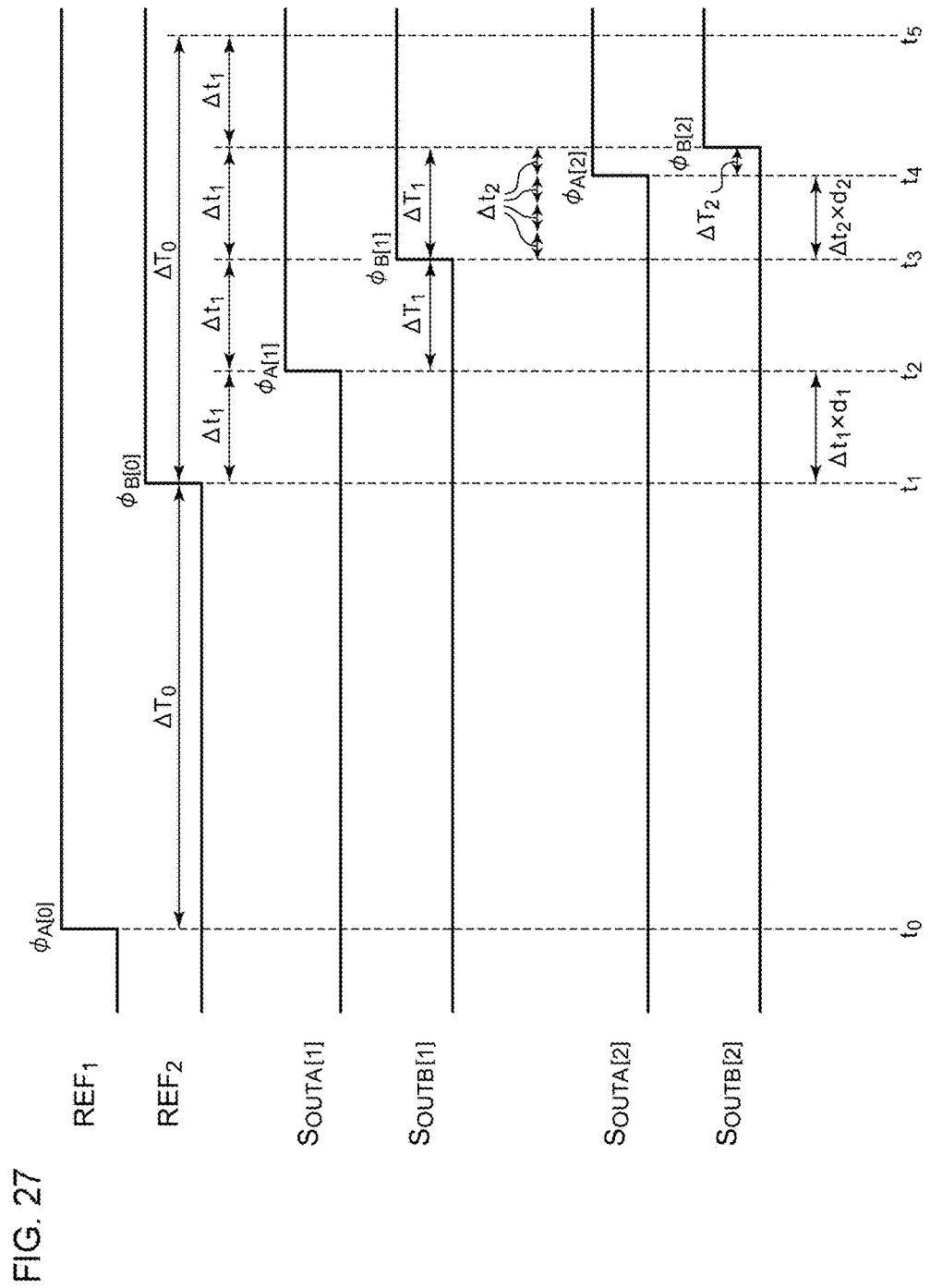
FIG. 27 is an operation waveform diagram showing the operation of the timing generator shown in FIG. 25.

The above is the configuration of the timing generator 100. Next, description will be made regarding the operation thereof. FIG. 27 is an operation waveform diagram showing the operation of the timing generator 100 shown in FIG. 25.

For ease of understanding, description will be made below regarding an example in which N=2, and $K_1 = K_2 = 4$. Furthermore, description will be made assuming that the offset delay amount $\tau$ provided by each stage is zero. The reference signals $REF_1$ and $REF_2$ having a time difference $\Delta T_0$ are supplied to the first stage. FIG. 27 shows an operation when the codes $d_1 = 1$ and $d_2 = 3$ are supplied.

The main interpolator 112 in the first stage generates an output $S_{OUTA[1]}$ having an edge that occurs at a timing $\phi_A[1]$ at the time point $t_2$.

$$t_2 = t_1 + \Delta t_{[1]} \times d_1 = t_1 + \Delta t_{[1]}$$

The auxiliary interpolator 114 in the first stage generates an output $S_{OUTB[1]}$ having an edge that occurs at a timing $\phi_{B[i]}$ at the time point $t_3$.

$$t_3 = t_2 + \Delta T_{[i]}$$

The main interpolator 112 in the second stage generates an output $S_{OUTA[2]}$ having an edge that occurs at a timing $\phi_{A[2]}$ at the time point $t_4$.

$$t_4 = t_3 + \Delta t_{[2]} \times d_2 = t_3 + 3 \times \Delta t_{[2]}$$

The auxiliary interpolator 114 in the second stage generates an output $S_{OUTB[2]}$ having an edge that occurs at a timing $\phi_{B[2]}$ at the time point $t_5$.

$$t_5 = t_4 + \Delta T_{[2]}$$

In this example, the output $S_{OUTA[2]}$ of the main interpolator 112 in the second stage is extracted as the output of the timing generator 100. The edge $\phi_{OUTA[2]}$ occurs in the output $S_{OUTA[2]}$ with a phase that corresponds to the two control data $D_{CNT}$.

Figure 28:
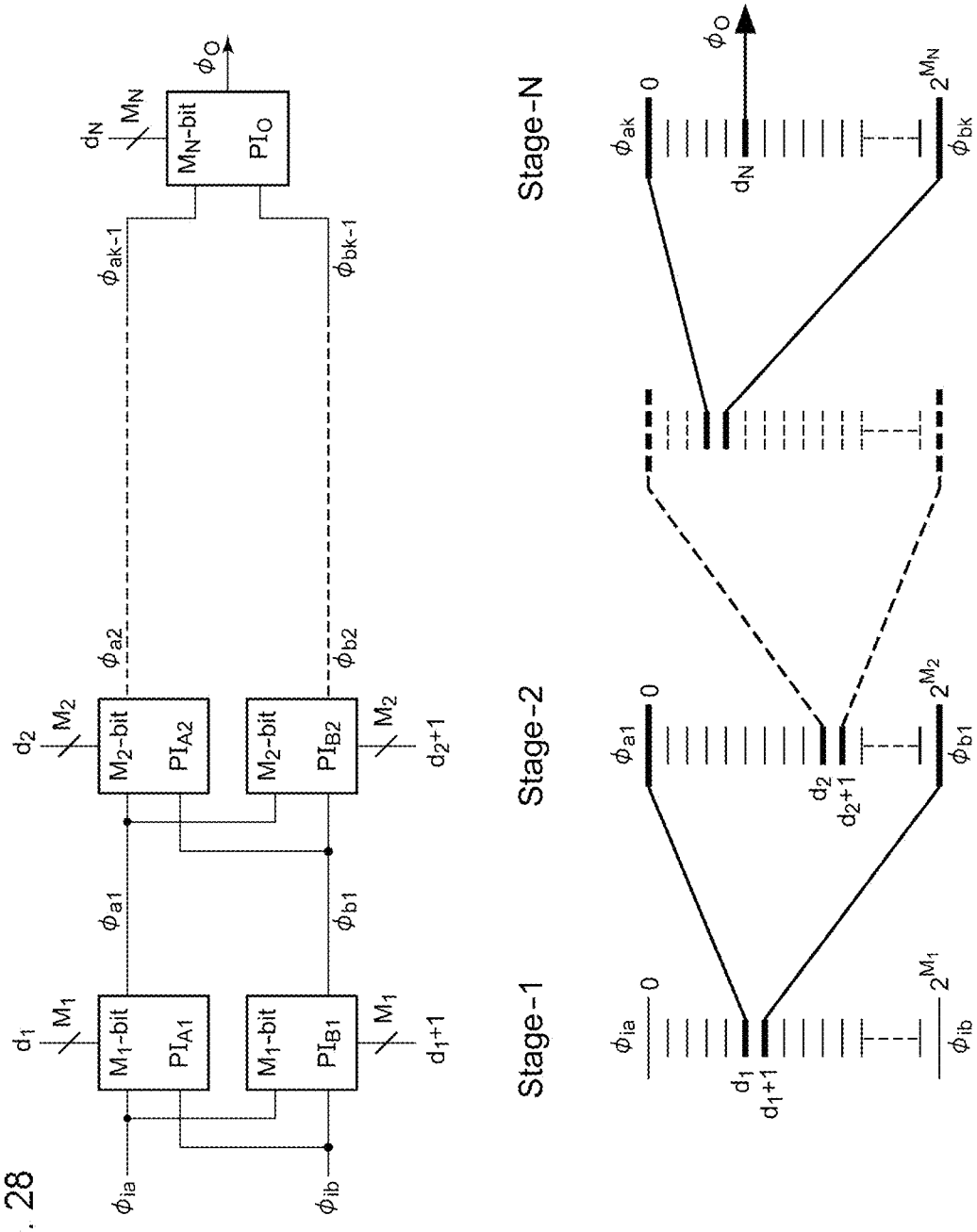
FIG. 28 is a diagram for explaining a pipeline operation of the timing generator shown in FIG. 25.

FIG. 28 is a diagram for explaining a pipeline operation of the timing generator shown in FIG. 25. Here, $M_1$ represents the resolution provided by the i-th stage, and the relation $K_i=2^{Mi}$ holds true. The time difference $\Delta T$ between the two outputs becomes $\frac{1}{2}^{Mi}$ times that of the outputs in the immediately previous stage, and accordingly, the time resolution becomes higher every time the signals pass through a stage.

The above is the operation of the timing generator 100. With the timing generator 100, as the number of stages N is increased, and as the resolution $K_i$ to be provided by each stage is raised, the phase resolution becomes higher. As a generalization of this, the number of interpolation levels provided by the timing generator 100 is represented by $K_1 \times K_2 \times \ldots \times K_N$. When $K_1=K_2= \ldots =K_N=K$, with the number of stages as N, this arrangement is capable of controlling the phase in $K^N$ levels. In this case, the time resolution is represented by $\Delta T_0/K^N$. For example, in a case in which K=16 and N=2, this arrangement is capable of controlling the phase in 256 levels (which corresponds to 8 bits).

The timing generator 100 has the following advantages.

First, the timing generator does not necessarily require a high-speed clock in order to support a fine time resolution. In a case in which only a low-speed clock can be employed, and accordingly, in a case in which the time difference $\Delta T_0$ between the two reference signals $REF_1$ and $REF_2$ is large, the number of stages is increased and/or the number of interpolation levels for each stage is increased, thereby providing improved time resolution.

Second, the timing generator 100 has the advantages of a small circuit area and also small power consumption. Specifically, in comparison with the timing generator 40 shown in FIG. 24A, this arrangement allows the number of the phase interpolators PI required for supporting the same time resolution to be dramatically reduced. On the other hand, in comparison with the arrangements including the timing generator 50 shown in FIG. 24B, by raising the resolution K for each stage, this arrangement allows the number of the stages required for supporting the same time resolution to be reduced.

In addition, with the timing generator 100, all the phase interpolators PI contribute to the output. That is to say, this arrangement involves no wasteful power consumption, which is advantageous from the viewpoint of power consumption.

Furthermore, relating to power consumption, the timing generator 100 operates only when the two reference signals $REF_1$ and $REF_2$ are changed, thereby providing an advantage of involving no wasteful power consumption.

Third, the timing generator 100 requires no analog switch (multiplexer) on the signal path. Furthermore, the timing generator 100 has an advantage of allowing the number N of stages to be adjusted by adjusting the resolution $K_i$ to be provided by each stage. As described above, the time resolution degrades due to, or is limited by, the multiplexer (switch) 52 on the signal path. Furthermore, with the timing generator 50 shown in FIG. 24B, the number of stages is required to be increased according to the required time resolution. In a case in which the number of stages is increased, such an arrangement is greatly affected by variation of the delay amount. This leads to degraded linearity of the timing control operation, resulting in degradation of the effective time resolution. In contrast, with the timing generator 100, there is no need to switch the signal path. Accordingly, such an arrangement requires no multiplexer. Furthermore, such an arrangement allows an increase in the number of stages required for improving the time resolution to be reduced even in a case in which the time resolution is to be raised. Accordingly, such an arrangement allows fine time resolution of several ps or less to be supported with high linearity. Of course, the timing generator 100 may also be employed for an application that requires time resolution of several dozen ps to sub ns.

Fourth, the timing generator 100 has no feedback loop. This provides an advantage of providing a high-speed startup operation.

Fifth, by employing any one of the phase interpolators described above with reference to FIG. 1 through FIG. 22 as a phase interpolator included in the timing generator 100, this arrangement has an advantage of suppressing the effects due to process variation, power supply voltage variation, and temperature variation.

Next, description will be made regarding a modification of the timing generator 100.

First Modification

Figure 29:
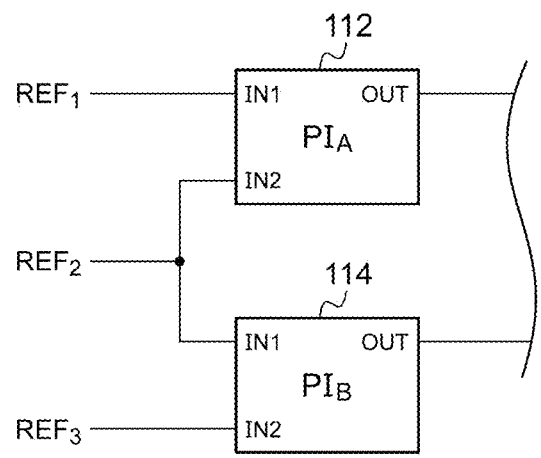
FIG. 29 is a circuit diagram showing a timing generator according to a first modification.

FIG. 29 is a circuit diagram showing a timing generator 100 according to a first modification. In the first stage 110_1, a reference signal $REF_1$ is input to the first input node N1 of the main interpolator 112. A common reference signal $REF_2$ is input to the second input node N2 of the main interpolator 112 and the first input node N1 of the auxiliary interpolator 114. A reference signal $REF_3$ is input to the second input node N2 of the auxiliary interpolator 114.

Second Modification

Description has been made in the embodiment regarding an arrangement in which the output of the auxiliary interpolator 114 is generated as a signal that is delayed with reference to the output of the main interpolator 112. However, the present invention is not restricted to such an arrangement. Also, the output of the main interpolator 112 may also be generated as a signal that is advanced with reference to the output of the auxiliary interpolator 114.

$$d_{A[i]} = d_i - J_{[i]}$$

$$d_{B[i]} = d_i$$

Usage

Figure 30:
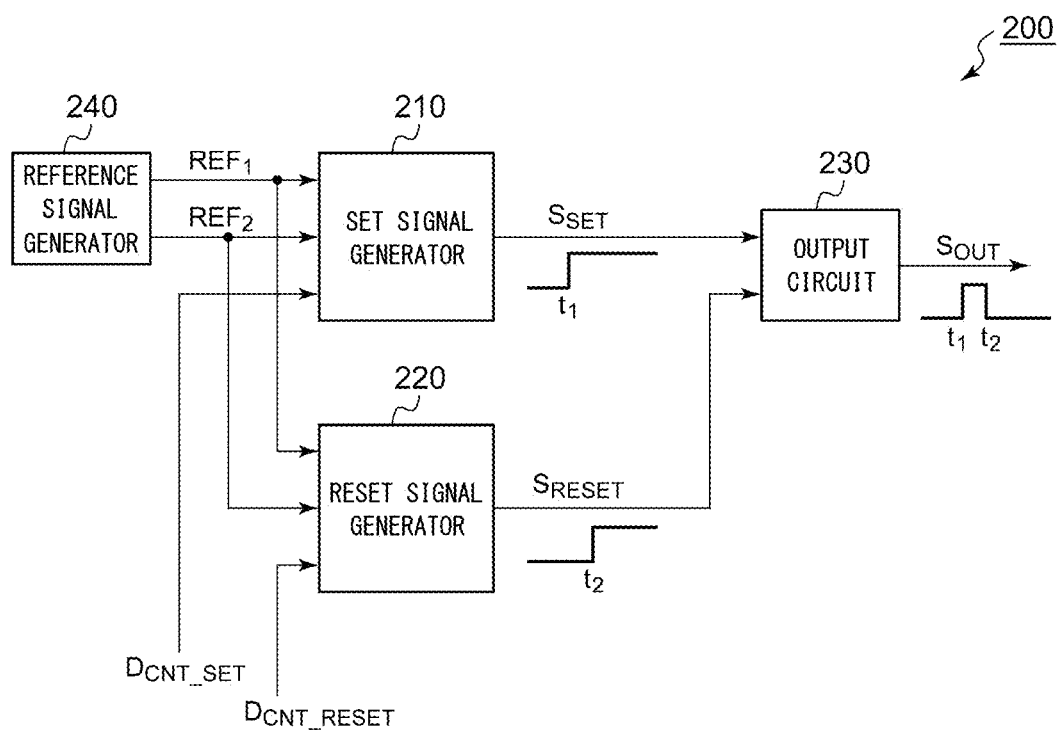
FIG. 30 is a circuit diagram showing a delay pulse generator employing the timing generator.

Next, description will be made regarding the usage of the timing generator 100. FIG. 30 is a circuit diagram showing a delay pulse generator 200 employing the timing generator 100. The delay pulse generator 200 includes a set signal generator 210, a reset signal generator 220, an output circuit 230, and a reference signal generator 240. At least one from among the set signal generator 210 and the reset signal generator 220 includes the timing generator 100 shown in FIG. 24.

The reference signal generator 240 generates reference signals $REF_1$ and $REF_2$ each having a predetermined frequency, and supplies the reference signals thus generated to the set signal generator 210 and the reset signal generator 220. The set signal generator 210 generates a set signal $S_{SET}$ having an edge that occurs at a timing $t_1$ that corresponds to the control data $D_{CNT\_SET}$. The reset signal generator 220 generates a reset signal $S_{RESET}$ having an edge that occurs at a timing $t_2$ that corresponds to the control data $D_{CNT\_RESET}$. The output circuit 230 generates a pulse signal $S_{OUT}$ that transits to a first level (e.g., high level) in response to the set signal $S_{SET}$, and that transits to a second level (e.g., low level) in response to the reset signal $S_{RESET}$. The configuration of the output circuit 230 is not restricted in particular. The output circuit 230 may be configured using a flip-flop or a latch.

The delay pulse generator 200 is capable of setting a pair of edges of the pulse signal $S_{OUT}$ at desired timings $t_1$ and $t_2$ according to the control data $D_{CNT\_SET}$ and $D_{CNT\_RESET}$. The delay pulse generator 200 can be employed as a digital pulse width modulator (DPMW), for example.

In a case in which the delay pulse generator 200 is employed as a digital pulse width modulator, the period of the pulse signal $S_{OUT}$ is constant. Accordingly, either the control data value $D_{CNT\_SET}$ or $D_{CNT\_RESET}$ (i.e., either the positive edge timing (rising edge or leading edge) or the negative edge timing (falling edge or trailing edge) of the pulse signal $S_{OUT}$) may be fixed. In this case, the other control data is configured as variable data. This arrangement is capable of changing the pulse width (the length of the high period or otherwise low period).

Alternatively, in a case in which the positive edge timing of the pulse signal $S_{OUT}$ is fixed, only the reset signal generator 220 may be configured using the timing generator 100, and the set signal generator 210 may be configured as a delay circuit. Conversely, in a case in which the negative edge timing of the pulse signal $S_{OUT}$ is fixed, only the set signal generator 210 may be configured using the timing generator 100, and the reset signal generator 220 may be configured as a delay circuit.

Next, description will be made regarding the usage of the delay pulse generator 200. The delay pulse generator 200 may be employed for various kinds of digital controller ICs (Integrated Circuits).

Figure 31:
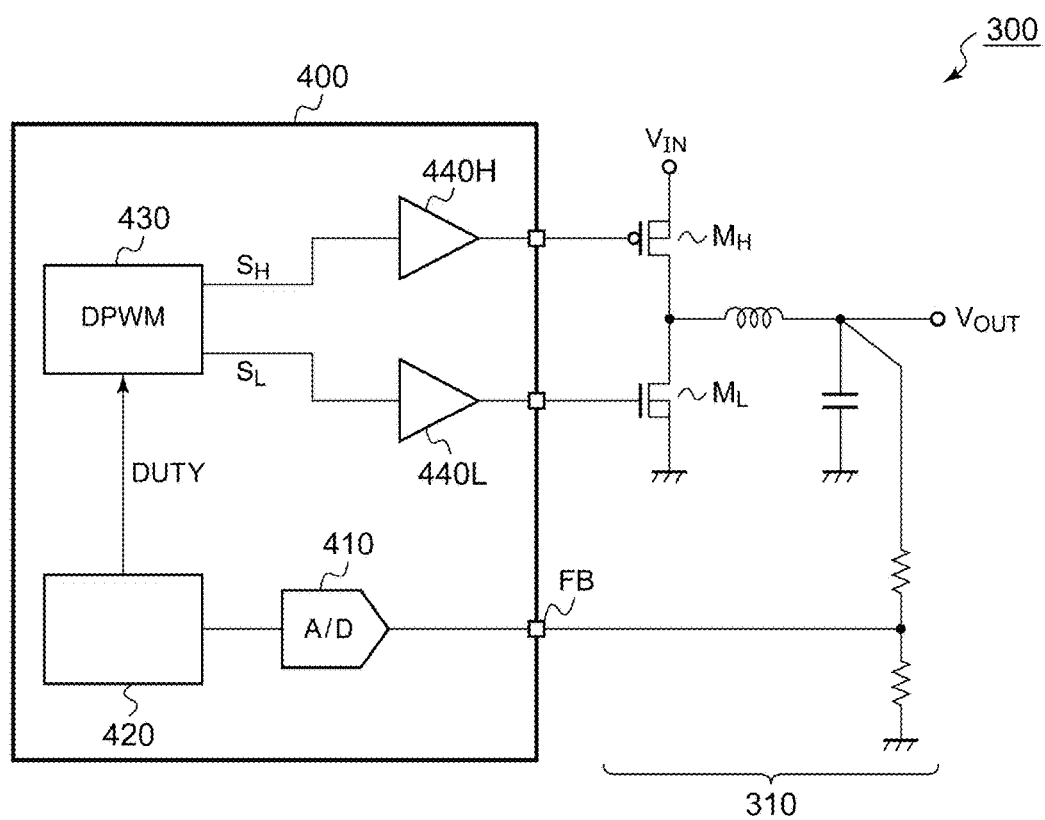
FIG. 31 is a block diagram showing a digital-control switching power supply.

FIG. 31 is a block diagram showing a digital-control switching power supply 300. The switching power supply 300 includes a peripheral circuit 310 in addition to a controller 400. FIG. 31 shows a step-down (buck) converter. However, the topology of the peripheral circuit 310 is not restricted to such an arrangement. Also, various kinds of circuit configurations may be employed, examples of which include step-up converters, step-up/step-down converters, flyback converters, forward converts, etc.

The controller 400 is configured as an IC (Integrated Circuit) integrated as a single semiconductor chip. Also, transistors $M_H$ and $M_L$ may be integrated on the controller 400. A feedback signal $V_{FB}$ that corresponds to the output voltage $V_{OUT}$ is input to a feedback (FB) pin of the controller 400. An A/D converter 410 converts the feedback signal $V_{FB}$ into a digital signal $D_{FB}$. The digital controller 420 feedback controls the duty ratio instruction value DUTY such that the digital signal $D_{FB}$ approaches a target value $D_{REF}$. The digital controller 420 includes a PI (Proportional Integral) controller or a PID (Proportional Integral Derivative) controller.

The digital pulse width modulator 430 is configured using an architecture of the delay pulse generator 200 shown in FIG. 30. The digital pulse width modulator 430 generates a high-side pulse $S_H$ having a pulse width that corresponds to the duty ratio instruction value DUTY and a low-side pulse $S_L$ that is complementary with respect to the high-side pulse. A high-side driver 440H and a low-side driver 440L drive the transistors $M_H$ and $M_L$ included in the peripheral circuit 310 according to the high-side pulse $S_H$ and the low-side pulse $S_L$, respectively.

Description will be made in this example regarding a constant voltage output arrangement. Also, the present invention is applicable to a constant current output arrangement.

Figure 32:
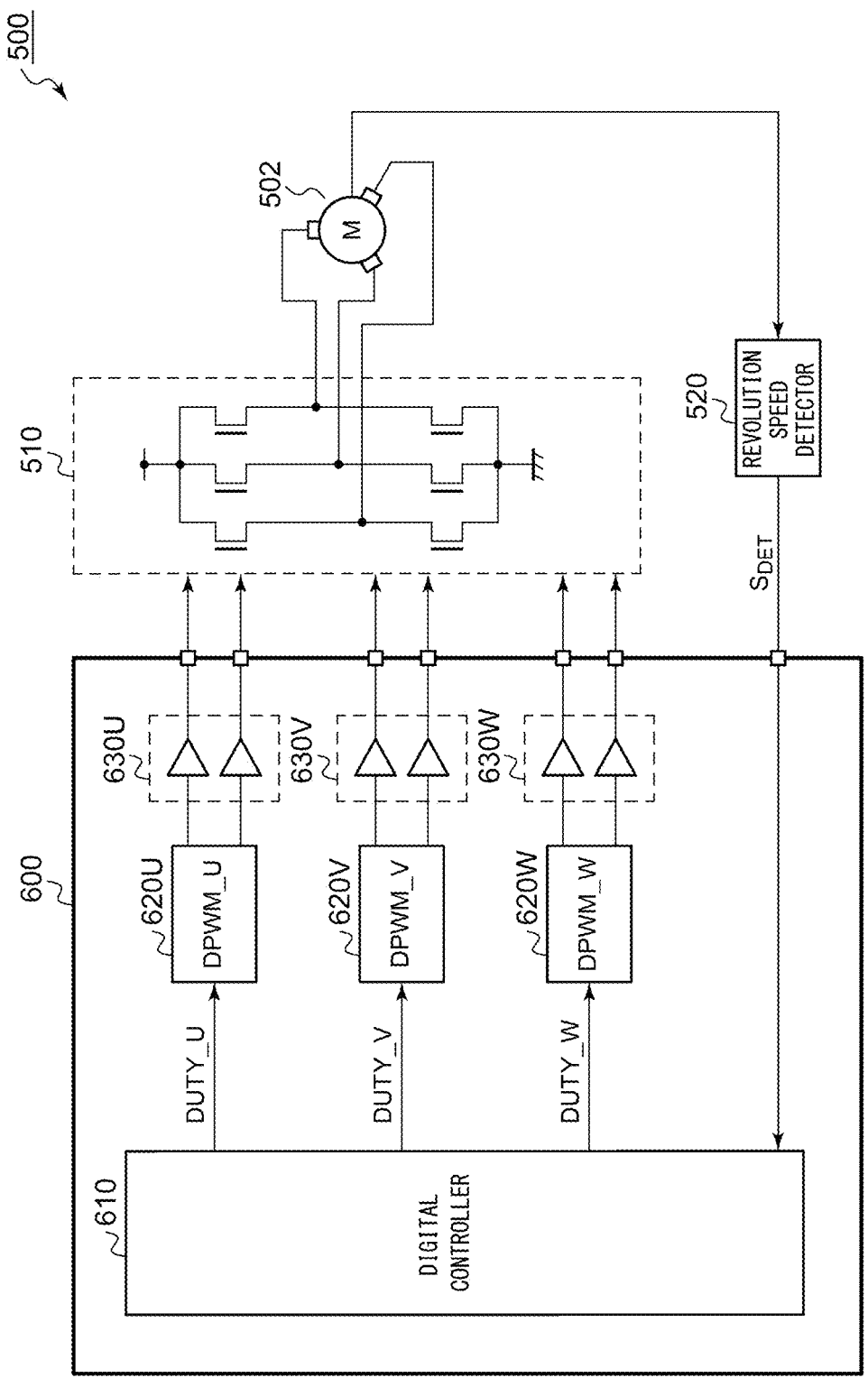
FIG. 32 is a block diagram showing a motor driving system.

FIG. 32 is a block diagram showing a motor driving system 500. The motor driving system 500 includes a three-phase motor 502, a three-phase inverter 510, a revolution speed detector 520, and a motor controller 600.

The revolution speed detector 520 generates a revolution speed signal $S_{DET}$ that indicates the revolution speed of the three-phase motor 502. The motor controller 600 controls the three-phase inverter 510 such that the current revolution speed indicated by the revolution speed signal $S_{DET}$ approaches a target revolution speed.

The motor controller 600 is configured as an IC (Integrated Circuit) integrated as a single semiconductor chip. The motor controller 600 includes a digital controller 610, digital pulse modulators 620U through 620W, and gate drivers 630U through 630W.

The digital controller 610 generates duty ratio instruction values DUTY_U through DUTY_W such that the current revolution speed indicated by the revolution speed signal $S_{DET}$ approaches a target revolution speed. The configuration and the control method to be employed for the digital controller 610 are not restricted in particular. Also, known techniques may be employed. The digital pulse modulators 620U through 620W generate pulse signals $S_{OUT\_U}$ through $S_{OUT\_W}$ having pulse widths that correspond to the duty ratio instruction values DUTY_U through DUTY_W, respectively. The gate drivers 630U through 630W drive the corresponding legs according to the respective pulse signals $S_{OUT\_U}$ through $S_{OUT\_W}$.

Description has been made in this example regarding a revolution speed control system. However, the present invention is also applicable to a motor driving system for controlling a torque or a position. Also, the digital pulse modulator 620 and the gate driver 630 may be integrated on a single IC.

Figure 33A:
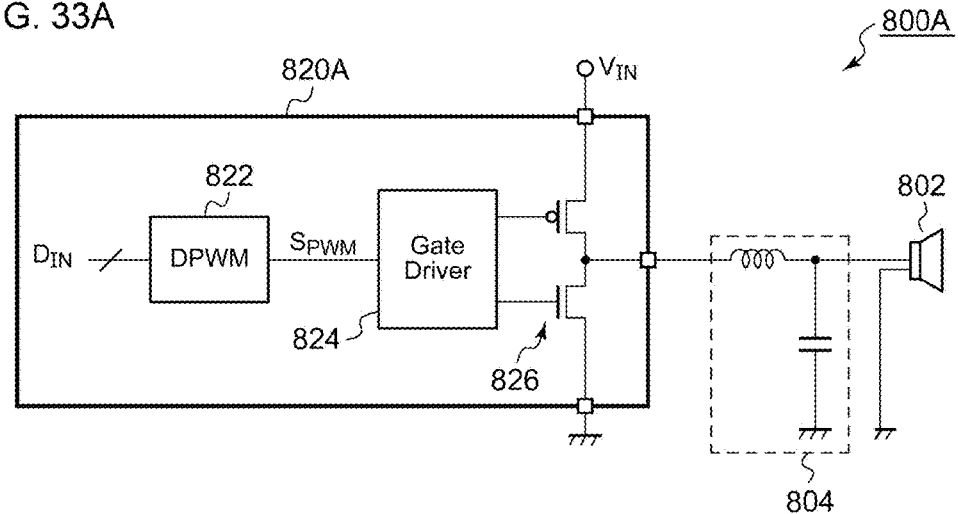
FIG. 33A and FIG. 33B are block diagrams each showing an audio circuit.
Figure 33B:
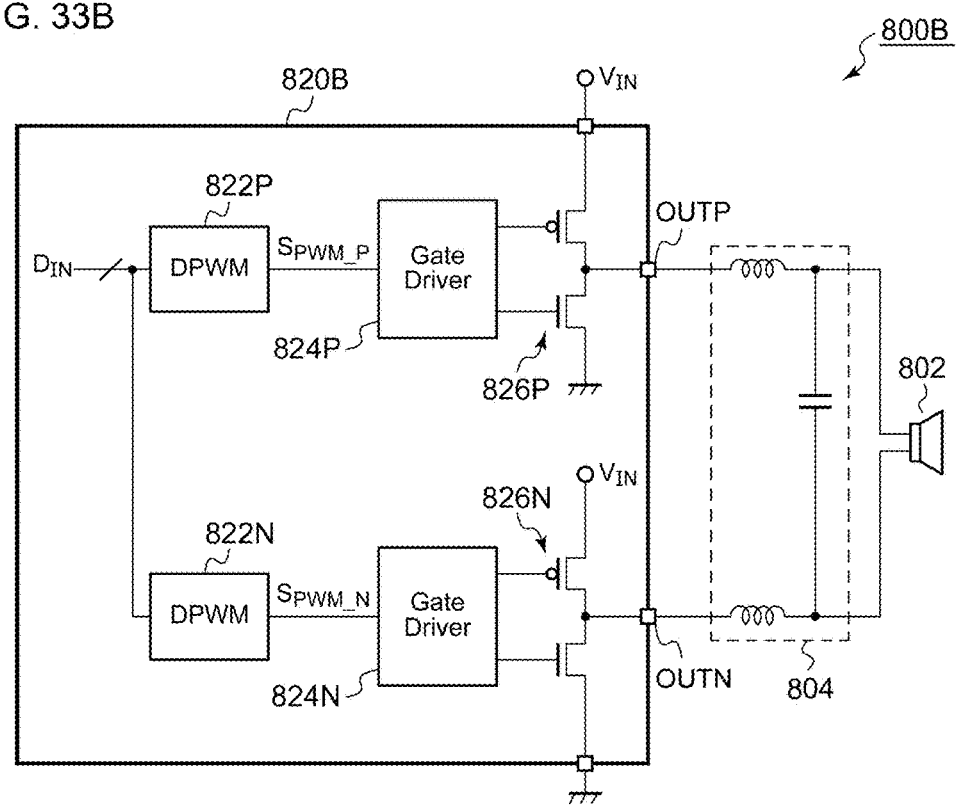

FIG. 33A and FIG. 33B are block diagrams each showing an audio circuit. FIG. 33A shows a single-ended audio circuit. FIG. 33B shows a BTL (Bridged Transformerless) audio circuit. However, both the circuits have the same basic configuration. An audio circuit 800 includes an electroacoustic conversion element 802, a filter 804, and an audio IC 820. The electroacoustic conversion element 802 is configured as a speaker or headphones, and converts an electric signal into an acoustic signal. The filter 804 removes the high-frequency component of a PWM (Pulse Width Modulation) signal generated by the audio IC 820, and supplies the PWM signal to the electroacoustic conversion element 802.

The audio IC 820 includes a digital pulse width modulator 822, a gate driver 824, and a class D amplifier 826. The digital pulse width modulator 822 converts a digital audio signal DIN into a PWM signal $S_{PWM}$. The gate driver 824 drives the class D amplifier 826 according to the PWM signal.

In FIG. 33A and FIG. 33B, the digital pulse width modulator 822 may be configured using an architecture of the delay pulse generator 200 described above.

Figure 34:
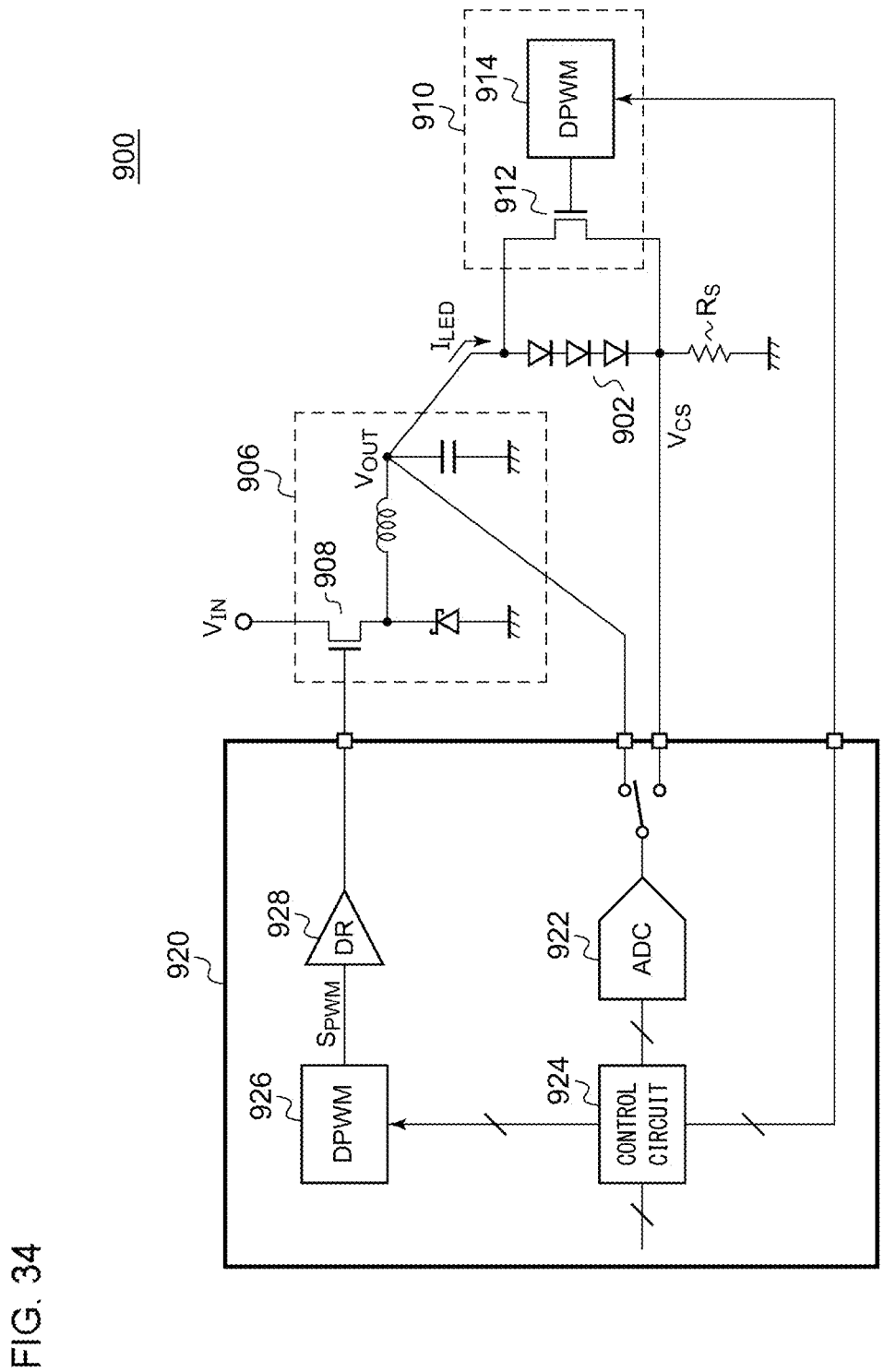
FIG. 34 is a block diagram showing a light emitting apparatus.

FIG. 34 is a block diagram showing a light-emitting apparatus. A light emitting apparatus 900 includes an LED 902, a dimming circuit 904, a DC/DC converter 906, and an LED driver controller 920.

The DC/DC converter 906 supplies a driving voltage $V_{OUT}$ to the LED 902, and outputs a current $I_{LED}$ stabilized to a constant value to the LED 902. The topology of the DC/DC converter 906 is not restricted in particular. The DC/DC converter 906 may be configured as a synchronous rectification step-down converter. Alternatively, the DC/DC converter 906 may be configured as a step-up converter or a flyback converter. A sensing resistor $R_S$ is arranged in series with the LED 902 in order to detect a current $I_{LED}$ that flows through the LED 902 (or otherwise the dimming circuit 910). The dimming circuit 910 switches on and off the current $I_{LED}$ that flows through the LED 902 with a duty ratio that corresponds to a target luminance. The dimming circuit 910 includes a bypass switch 912 arranged in parallel with the LED 902 and a digital pulse width modulator 914. The digital pulse width modulator 914 generates a PWM signal having a duty ratio that corresponds to the target luminance of the LED 902, and drives the bypass switch 912 according to the PWM signal. The digital pulse width modulator 914 may be configured using the architecture of the delay pulse generator 200 described above.

The LED driver controller 920 drives a switching element 908 included in the DC/DC converter 906 such that the output current $I_{LED}$ of the DC/DC converter 906 becomes a constant value. In an operation range in which the current $I_{LED}$ is large to some extent, the A/D converter 922 converts a current detection signal $V_{CS}$ into a digital value. A controller 924 generates a duty ratio instruction value DUTY such that the current detection signal $V_{CS}$ approaches a target value (constant current mode). In an operation range in which the current $I_{LED}$ is excessively small, it is difficult to detect the current detection signal $V_{CS}$. Accordingly, the A/D converter 922 converts the output voltage $V_{OUT}$ into a digital value. The controller 924 generates the duty ratio instruction value DUTY such that the output voltage $V_{OUT}$ approaches a target value (constant voltage mode). A digital pulse width modulator 926 generates a PWM signal $S_{PWM}$ that corresponds to the duty ratio instruction value DUTY. The driver 928 drives the switching element of the DC/DC converter 906 according to the PWM signal $S_{PWM}$. Also, the digital pulse width modulator 926 may be configured using the architecture of the delay pulse modulator 200 described above.

While the preferred embodiments of the present invention have been described using specific terms, such description is for illustrative purposes only, and it is to be understood that changes and variations may be made without departing from the spirit or scope of the appended claims.

What is claimed is:

1. A semiconductor integrated circuit comprising:
a set signal generator structured to generate a set signal; and
a reset signal generator structured to generate a reset signal,
wherein at least one from among the set signal generator and the reset signal generator comprises a timing generator, the timing generator comprising N (N≥2) stages,
wherein an i-th (1≤i≤N−1) stage comprises a first phase interpolator and a second phase interpolator,
wherein an output node of the first phase interpolator in the i-th (1≤i≤N−1) stage is coupled to a first input node of each of the first phase interpolator and the second interpolator in the (i+1)-th stage,
wherein an output node of the second phase interpolator in the i-th stage is coupled to a second input node of each of the first phase interpolator and the second interpolator in the (i+1)-th stage,
wherein the first phase interpolator and the second phase interpolator are each arranged such that a first signal is received via the first input node and such that a second signal is received via the second input node, and structured to generate an output signal having an edge at a timing that corresponds to control data,
and wherein the first phase interpolator and the second phase interpolator each comprise a phase interpolator, the phase interpolator comprising:
a first input node coupled to receive a first signal that transits from a first level to a second level;
a second input node coupled to receive a second signal that transits from the first level to the second level with a delay with respect to the first signal;
a first line coupled to receive a first voltage;
a second line coupled to receive a second voltage;
an intermediate line;
a capacitor having one end coupled to the intermediate line;
an initializing circuit structured to initialize a voltage across the capacitor during a period in which the first signal and the second signal are both set to the first level;
a plurality of circuit units that correspond to a plurality of bits of an input code, and coupled in parallel between the intermediate line and the second line; and
an output circuit structured to generate an output signal having a level that changes when the voltage across the capacitor crosses a predetermined threshold value,
wherein each circuit unit comprises:
a resistor and a first path arranged in series between the intermediate line and the second line; and
a second path arranged in parallel with the first path,
wherein the first path is structured such that, when the first signal is set to the second level and the corresponding bit of the input code is set to a first value, the first path is turned on,
wherein the second path is structured such that, when the second signal is set to the second level and the corresponding bit of the input code is set to a second value, the second path is turned on,
and wherein the semiconductor integrated circuit is structured to output a pulse signal that transits to a first level according to an output signal of the set signal generator, and that transits to a second level according to an output signal of the reset signal generator.

2. A semiconductor integrated circuit comprising:
a set signal generator structured to generate a set signal; and
a reset signal generator structured to generate a reset signal,
wherein at least one from among the set signal generator and the reset signal generator comprises a timing generator, the timing generator comprising N (N≥2) stages,
wherein an i-th (1≤i≤N−1) stage comprises a first phase interpolator and a second phase interpolator,
wherein an output node of the first phase interpolator in the i-th (1≤i≤N−1) stage is coupled to a first input node of each of the first phase interpolator and the second interpolator in the (i+1)-th stage,
wherein an output node of the second phase interpolator in the i-th stage is coupled to a second input node of each of the first phase interpolator and the second interpolator in the (i+1)-th stage,
wherein the first phase interpolator and the second phase interpolator are each arranged such that a first signal is received via the first input node and such that a second signal is received via the second input node, and structured to generate an output signal having an edge at a timing that corresponds to control data, and wherein the semiconductor integrated circuit is structured to output a pulse signal that transits to a first level according to an output signal of the set signal generator, and that transits to a second level according to an output signal of the reset signal generator.

3. The semiconductor integrated circuit according to claim 2, wherein the pulse signal is configured as a pulse width modulation signal.

4. The semiconductor integrated circuit according to claim 2, configured as a controller for a class D amplifier.

5. The semiconductor integrated circuit according to claim 2, configured as a controller for a DC/DC converter.

6. The semiconductor integrated circuit according to claim 2, configured as a controller for an LED driver.

7. The semiconductor integrated circuit according to claim 2, configured as a controller for a motor.

8. The semiconductor integrated circuit according to claim 2, wherein, in the i-th ($1 \leq i \leq N-1$) stage, there is a time difference between edges of output signals of the first phase interpolator and the second phase interpolator that corresponds to a time resolution provided by the stage.

9. The semiconductor integrated circuit according to claim 2, wherein, in the first stage, a common first reference signal is input to each of the first input nodes of the first phase interpolator and the second phase interpolator, and a common second reference signal is input to each of the second input nodes of the first phase interpolator and the second phase interpolator.

10. The semiconductor integrated circuit according to claim 2, wherein, in the first stage, a common signal is input to each of the second input node of the first phase interpolator and the first input node of the second phase interpolator.

11. The semiconductor integrated circuit according to claim 2, wherein the first phase interpolator and the second phase interpolator each comprise:
 a capacitor;
 a charging/discharging circuit structured (i) to charge or otherwise discharge the capacitor with an amount of current that corresponds to the control data according to the first signal, and (ii) to charge or otherwise discharge the capacitor with a constant amount of current according to the second signal; and
 an output circuit structured to generate the output signal having a level that changes when a voltage across the capacitor reaches a threshold value.

* * * * *